(12) United States Patent
Park et al.

(10) Patent No.: US 11,581,517 B2
(45) Date of Patent: Feb. 14, 2023

(54) DISPLAY DEVICE COMPRISING AN OXIDE LAYER

(71) Applicant: Samsung Display Co., Ltd., Yongin-si (KR)

(72) Inventors: Joon Seok Park, Yongin-si (KR); Yeon Keon Moon, Hwaseong-si (KR); Myoung Hwa Kim, Seoul (KR); Tae Sang Kim, Seoul (KR); Hyung Jun Kim, Seoul (KR); Geun Chul Park, Suwon-si (KR); Sang Woo Sohn, Yongin-si (KR); Jun Hyung Lim, Seoul (KR); Kyung Jin Jeon, Incheon (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 156 days.

(21) Appl. No.: 16/837,540

(22) Filed: Apr. 1, 2020

(65) Prior Publication Data

US 2021/0020872 A1    Jan. 21, 2021

(30) Foreign Application Priority Data

Jul. 19, 2019    (KR) .......................... 10-2019-0087678

(51) Int. Cl.
*H01L 51/56*    (2006.01)
*G09G 3/3266*    (2016.01)
(Continued)

(52) U.S. Cl.
CPC ............. *H01L 51/56* (2013.01); *G09G 3/325* (2013.01); *G09G 3/3266* (2013.01);
(Continued)

(58) Field of Classification Search
CPC . H01L 51/56; H01L 29/4908; H01L 29/7869; G09G 3/325; G09G 3/3266; G09G 3/3291
(Continued)

(56) References Cited

U.S. PATENT DOCUMENTS

2010/0090594 A1*    4/2010    Choi .................... H01L 51/5215
313/506
2013/0306947 A1*    11/2013    Yamazaki ......... H01L 29/78618
257/40
(Continued)

FOREIGN PATENT DOCUMENTS

| JP | 2019-24105 A | 2/2019 |
|---|---|---|
| KR | 10-2012-0097152 A | 9/2012 |
| KR | 10-2018-0127882 A | 11/2018 |

*Primary Examiner* — Lex H Malsawma
*Assistant Examiner* — Eric W Jones
(74) *Attorney, Agent, or Firm* — Lewis Roca Rothgerber Christie LLP

(57) ABSTRACT

A display device includes pixels connected to scan lines and data lines intersecting the scan lines, wherein each of the pixels includes a light-emitting element, a driving transistor to control a driving current supplied to the light-emitting element according to a data voltage applied from the data lines, and a switching transistor to apply the data voltage of the data line to the driving transistor according to a scan signal applied from the scan lines. The driving transistor includes a first active layer having an oxide semiconductor and a first gate electrode below the first active layer. The switching transistor includes a second active layer having a same oxide semiconductor as the oxide semiconductor of the first active layer and a second gate electrode below the second active layer. At least one of the driving transistor and the switching transistor includes an oxide layer above each of the active layers.

20 Claims, 36 Drawing Sheets

(51) Int. Cl.
*G09G 3/3291* (2016.01)
*H01L 29/786* (2006.01)
*H01L 29/49* (2006.01)
*G09G 3/325* (2016.01)

(52) U.S. Cl.
CPC ....... *G09G 3/3291* (2013.01); *H01L 29/4908* (2013.01); *H01L 29/7869* (2013.01)

(58) Field of Classification Search
USPC .................................................... 257/40, 59
See application file for complete search history.

(56) References Cited

U.S. PATENT DOCUMENTS

2016/0276486 A1* 9/2016 Koezuka ........... H01L 29/78696
2017/0104089 A1* 4/2017 Koezuka ............. H01L 29/7869

* cited by examiner

NDA: NDA1, NDA2, NDA3, NDA4

FIG. 26
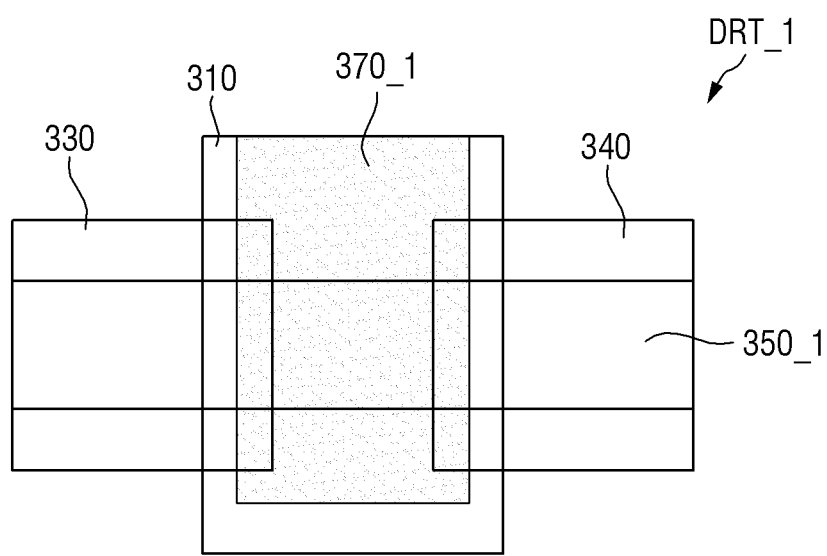
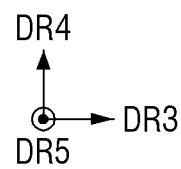

DISPLAY DEVICE COMPRISING AN OXIDE LAYER

CROSS-REFERENCE TO RELATED APPLICATION

This application claims priority to and the benefit of Korean Patent Application No. 10-2019-0087678, filed on Jul. 19, 2019 in the Korean Intellectual Property Office, the entire content of which is incorporated herein by reference.

BACKGROUND

1. Field

Embodiments of the present disclosure relate to a display device and a method of fabricating the same, and, for example, to a display device including a thin-film transistor including an oxide layer.

2. Description of the Related Art

Display devices have become more and more important as multimedia technology evolves. Accordingly, a variety of types of display devices such as organic light-emitting display (OLED) devices and liquid-crystal display (LCD) devices are currently being used.

Display devices are for displaying images and include a display panel such as an organic light-emitting display panel or a liquid-crystal display panel. Among them, a light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

Such a display device includes a display panel, a gate driver, a data driver, and a timing controller. The display panel includes data lines, gate lines, and pixels formed at the intersections of the data lines and the gate lines. Each of the pixels receives a data voltage from a data line when a gate signal is supplied to a gate line using a thin-film transistor as a switching element. Each of the pixels emits light with a set (e.g., predetermined) brightness according to the data voltages.

A display device capable of displaying images at a high resolution of ultra high definition (UHD) has been released. A display device capable of displaying images at a high resolution of 8K ultra high definition (UHD) is recently being developed. UHD refers to 3,840×2,160 resolution, and 8K UHD refers to 7,680×4,320 resolution.

In a high-resolution display device, the number of pixels increases, and accordingly the driving current of each of the pixels may be reduced. As a result, the driving voltage range of the driving transistor of each of the pixels may be reduced.

SUMMARY

The present disclosure provides a display device including a driving transistor and a switching transistor including an active layer and an oxide layer having an oxide semiconductor.

It should be noted that objects of the present disclosure are not limited to the above-mentioned object; and other objects of the present disclosure will be apparent to those skilled in the art from the following descriptions.

According to some embodiments, a display device may include a driving transistor and a switching transistor each having a gate electrode below an active layer, and at least one of them may include an oxide layer, which is an oxygen supply layer above the active layer. When the switching transistor includes the oxide layer, the device characteristics and reliability of the display device can be improved. When the driving transistor includes the oxide layer, a wide range of driving voltages can be achieved.

It should be noted that aspects and/or effects of the present disclosure are not limited to those described above and other aspects and/or effects of the present disclosure will be apparent to those skilled in the art from the following descriptions.

According to some embodiments of the present disclosure, a display device includes a substrate including a display area and a pad area; a first conductive layer on the substrate, the first conductive layer including a gate electrode in the display area and a pad electrode in the pad area; a buffer layer on the first conductive layer, the buffer layer covering the gate electrode and exposing a portion of the pad electrode; a first semiconductor layer on the buffer layer and including an oxide semiconductor, the first semiconductor layer including a first active layer and a second active layer in the display area; a second conductive layer on the first semiconductor layer, the second conductive layer including source electrodes and drain electrodes in the display area; a first protective layer on the second conductive layer, the first protective layer covering the source electrode and the drain electrode and exposing a portion of the pad electrode; a second semiconductor layer on the first protective layer and including an oxide semiconductor, the second semiconductor layer including at least one oxide layer in the display area; a first planarization layer on the second semiconductor layer; and a third conductive layer on the first planarization layer, the third conductive layer including a first electrode electrically connected to one of the source electrodes through a contact hole penetrating through the first planarization layer and the first protective layer, wherein the oxide layer of the second semiconductor layer is above at least one selected from the first active layer and the second active layer.

In some embodiments, the oxide semiconductor of the first semiconductor layer and the second semiconductor layer may include at least one selected from indium (In), gallium (Ga), zinc (Zn), tin (Sn) and hafnium (Hf).

In some embodiments, the second conductive layer may include a first source electrode at a first side of the first active layer; a first drain electrode at a second side of the first active layer; a second source electrode at a first side of the second active layer; and a second drain electrode at a second side of the second active layer.

In some embodiments, one side of the first source electrode may be aligned with one side of the first active layer, and one side of the first drain electrode may be aligned with another side of the first active layer, and another side of the first source electrode and another side of the first drain electrode may be on the first active layer.

In some embodiments, one side of the second source electrode may be on the buffer layer, and one side of the second drain electrode may be on the buffer layer, and another side of the second source electrode and another side of the second drain electrode may be on the second active layer.

In some embodiments, the first protective layer may include a plurality of grooves in which a portion of an upper surface of the first protective layer is recessed, and the grooves may include a first groove between the first source electrode and the first drain electrode, and a second groove between the second source electrode and the second drain electrode.

In some embodiments, the oxide layer of the second semiconductor layer may be in contact with the gate electrode through a contact hole penetrating through the first protective layer and the buffer layer to expose a portion of an upper surface of the gate electrode.

In some embodiments, the oxide layer may include a first oxide layer above the first active layer.

In some embodiments, the first groove may overlap the first active layer in a thickness direction, and the first oxide layer may be in the first groove portion.

In some embodiments, the second groove may overlap the second active layer in a thickness direction, and the oxide layer may include a second oxide layer in the second groove above the second active layer.

In some embodiments, the first protective layer may include a first contact hole penetrating through the first protective layer to expose a portion of an upper surface of the first source electrode, and a second contact hole penetrating through the first protective layer to expose a portion of an upper surface of the first drain electrode.

In some embodiments, the second semiconductor layer may include a first oxide pattern in contact with the first source electrode through the first contact hole, and a second oxide pattern in contact with the first drain electrode through the second contact hole.

In some embodiments, the first planarization layer may include a third contact hole penetrating through the first planarization layer and through the first protective layer to expose a portion of an upper surface of the second source electrode, and a fourth contact hole penetrating through the first planarization layer and through the first protective layer to expose a portion of an upper surface of the second drain electrode.

In some embodiments, the third conductive layer may include a first electrode pattern in contact with the second source electrode through the third contact hole, and a second electrode pattern in contact with the second drain electrode through the fourth contact hole.

In some embodiments, the buffer layer may include a fifth contact hole penetrating through the buffer layer to expose a portion of an upper surface of the pad electrode, and the second semiconductor layer may be in the pad area and further includes a third oxide pattern in contact with the pad electrode through the fifth contact hole.

In some embodiments, the first protective layer may further include a sixth contact hole penetrating through the first protective layer to expose a portion of the third oxide pattern and a portion of an upper surface of the buffer layer, and the third conductive layer may further include a third electrode pattern in the pad area and in contact with the third oxide pattern through the sixth contact hole.

According to some embodiments of the present disclosure, a display device includes pixels connected to scan lines and data lines intersecting the scan lines, wherein each of the pixels includes a light-emitting element, a driving transistor to control a driving current supplied to the light-emitting element according to a data voltage applied from the data lines, and a switching transistor to apply the data voltage of the data line to the driving transistor according to a scan signal applied from the scan lines, wherein the driving transistor includes a first active layer having an oxide semiconductor and a first gate electrode below the first active layer, wherein the switching transistor includes a second active layer having a same oxide semiconductor as the oxide semiconductor of the first active layer and a second gate electrode below the second active layer, and wherein at least one selected from the driving transistor and the switching transistor includes an oxide layer above each of the active layers.

In some embodiments, the oxide semiconductor of the oxide layer may include at least one selected from indium (In), gallium (Ga), zinc (Zn), tin (Sn), and hafnium (Hf).

In some embodiments, a first protective layer may be on the first active layer of the driving transistor and on the second active layer of the switching transistor, and the driving transistor may further include a first oxide layer on the first protective layer and overlapping the first active layer in a thickness direction.

In some embodiments, the switching transistor may further include a second oxide layer on the first protective layer and overlapping the second active layer in the thickness direction.

BRIEF DESCRIPTION OF THE DRAWINGS

The above and other aspects and features of some embodiments of the present disclosure will become more apparent by describing some embodiments thereof with reference to the attached drawings, in which:

FIG. 26 is a plan view showing a driving transistor according to some embodiments of the present disclosure.

DETAILED DESCRIPTION

Some embodiments of the present disclosure will now be described more fully hereinafter with reference to the accompanying drawings, in which some embodiments of the present disclosure are shown. The subject matter of the present disclosure may, however, be embodied in different forms and should not be construed as limited to the embodiments set forth in the present disclosure. Rather, these embodiments are described so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same or similar components (e.g., features) throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, some embodiments of the present disclosure will be described with reference to the accompanying drawings.

Figure 1:
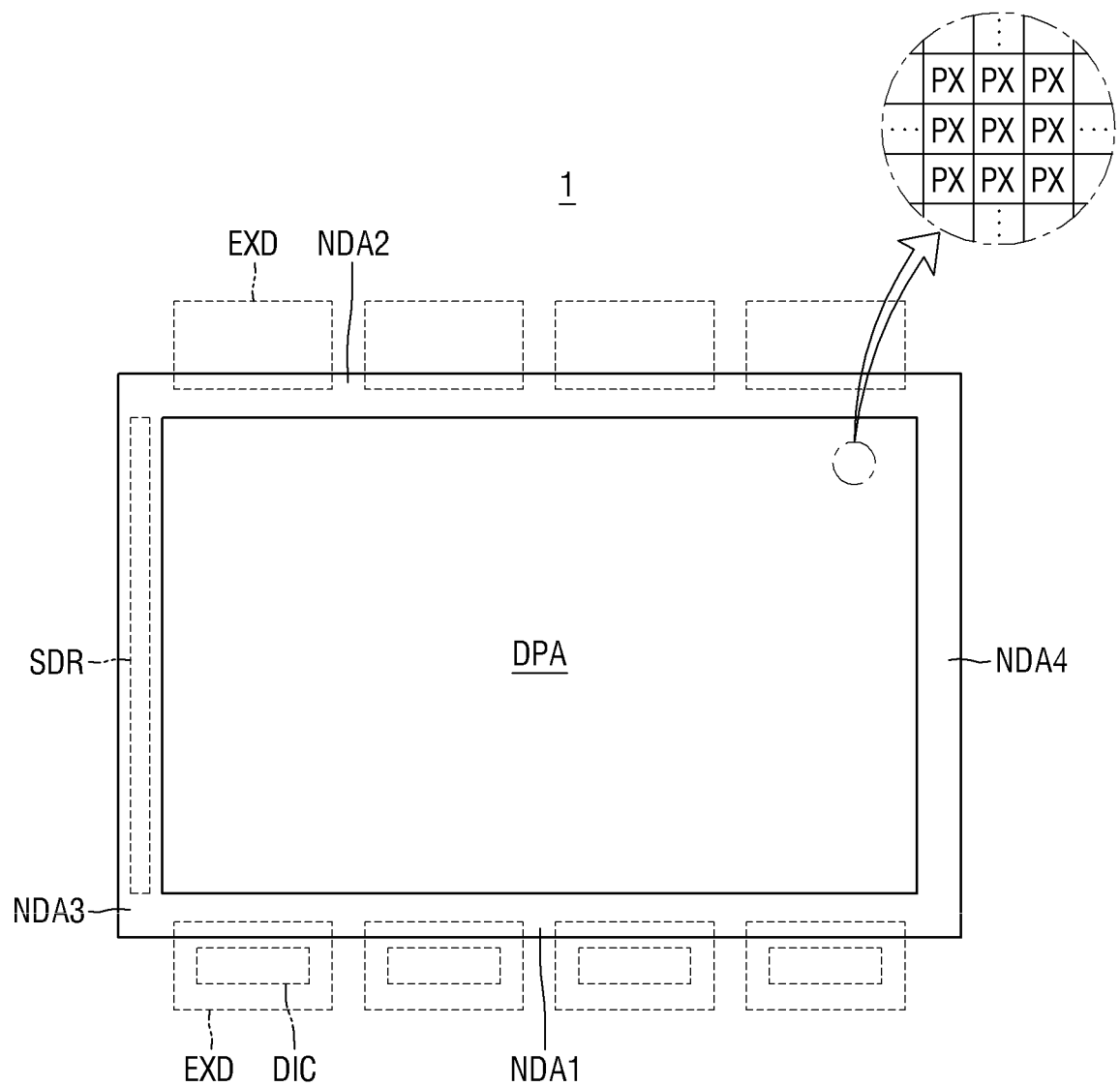
FIG. 1 is a plan view of a display device according to some embodiments of the present disclosure.

FIG. 1 is a plan view showing a display device according to some embodiments of the present disclosure.

Referring to FIG. 1, the display device 1 displays a moving image or a still image. The display device 1 may refer to (e.g., may be) any electronic device that includes a display screen. For example, the display device 1 may include a television set, a laptop computer, a monitor, an electronic billboard, Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 1 includes a display panel 10 for providing a display screen. Examples of the display panel may include an LED display panel, an organic light-emitting display panel, a quantum-dot light-emitting display panel, a plasma display panel, a field emission display panel, etc. In the following description, the display panel 10 is employed as (e.g., is assumed to be) an LED display panel, but the present disclosure is not limited thereto. Any other suitable display panel may be employed.

The shape of the display device 1 may be modified in a variety of ways. For example, the display device 1 may have shapes such as a rectangle with longer lateral (e.g., horizontal) sides, a rectangle with longer vertical sides, a square, a quadrangle with rounded corners (vertices), other polygons, a circle, etc. The shape of a display area DPA of the display device 1 may be similar to the overall shape of the display device 1. For example, FIG. 1 shows both the display device 1 and the display area DPA in the shape of a rectangle with longer horizontal sides.

The display device 1 may include the display area DPA and a non-display area NDA. In the display area DPA, images can be displayed. In the non-display area NDA, images are not displayed. The display area DPA may be referred to as an active area, while the non-display area NDA may be referred to as an inactive area.

The display area DPA may generally occupy the center of the display device 1. The display area DPA may include a plurality of pixels PX. The plurality of pixels PX may be arranged in a matrix when viewed from the top (e.g., when viewed from above the display device 1 so that the display device 1 is viewed in a plane). The shape of each pixel PX may be, but is not limited to, a rectangle or a square when viewed from the top. In some embodiments, each pixel PX may have a diamond shape having sides inclined with respect to a first direction DR1.

The non-display area NDA may be around the display area DPA. The non-display area NDA may surround (e.g., be around) the display area DPA entirely or partially. The display area DPA may have a rectangular shape, and the non-display area NDA may be adjacent to the sides (e.g., four sides) of the display area DPA. The non-display area NDA may provide (e.g., define) a bezel of the display device 1.

In the non-display area NDA, a driving circuit or a driving element for driving the display area DPA may be included. According to some embodiments of the present disclosure, pad units are on a display substrate of the display device 1 at a first non-display area NDA1 adjacent to a first longer side (e.g., the lower side in FIG. 1) of the display device 1 and a second non-display area NDA2 adjacent to a second longer side (e.g., the upper side in FIG. 1) of the display device 1. An external device EXD may be mounted on a pad electrode of each of the pad units. Some examples of the external device EXD may include a connection film, a printed circuit board, a driving chip DIC, a connector, a line connection film, etc. A scan driver SDR directly on the display substrate of the display device 1 may be at the third non-display area NDA3 adjacent to a first shorter side of the display device 1 (e.g., the left side in FIG. 1).

Figure 2:
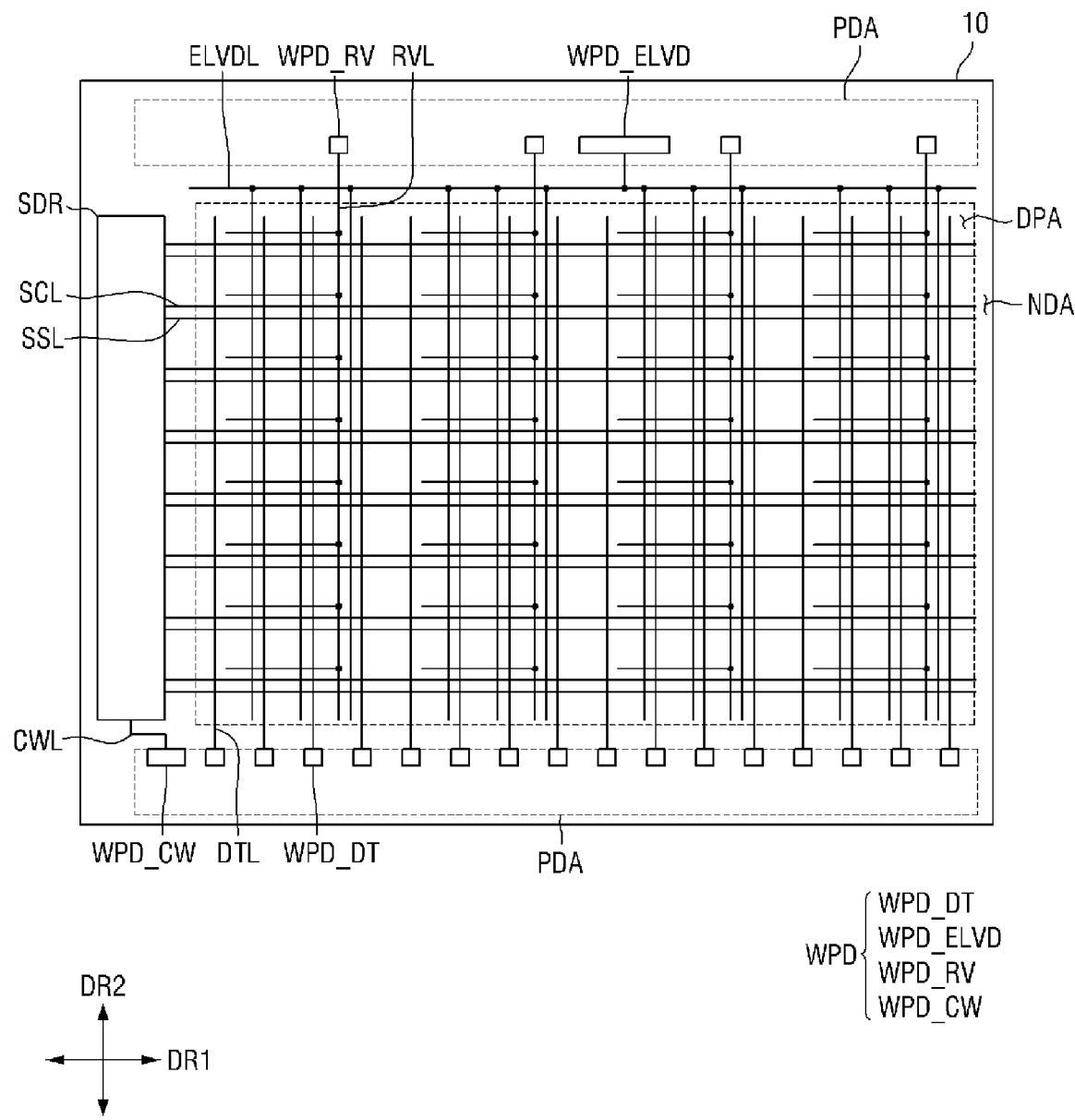
FIG. 2 is a plan view showing an example of a display device according to some embodiments of the present disclosure.

FIG. 2 is a plan view showing an example of a display device according to some embodiments of the present disclosure.

Referring to FIG. 2, the display device 1 may include the display panel 10 and a plurality of lines on the display panel 10. The plurality of lines may include a scan line SCL, a sensing signal line SSL, a data line DTL, a reference voltage line RVL, a first supply voltage line ELVDL, etc.

The display panel 10 may include the display area DPA where pixels PX display images, and the non-display area NDA, which is the peripheral area of the display area DPA. When the display panel 10 includes a curved portion, the display area DPA may be on the curved portion. In some embodiments, images of the display panel 10 can be seen on (e.g., from, through, etc.) the curved portion.

In some embodiments, the pixels PX, scan lines SCL, data lines DTL, and power lines connected to the pixels PX may be arranged in the display area DPA. The scan lines SCL may be arranged in the first direction DR1, while the data lines DTL may be arranged in a second direction DR2 intersecting the first direction DR1. Each of the pixels PX may be connected to at least one of the scan lines SCL and connected to at least one of the data lines DTL.

Each of the pixels PX may include a driving transistor, at least one switching transistor, a light-emitting element, and a capacitor. Because the switching transistor is turned on in response to a scan signal from a scan line SCL, the data voltage from the data line DTL may be applied to the gate electrode of the driving transistor. When the data voltage is applied to the gate electrode, the driving transistor may supply a driving current to the light-emitting element, so that light can be emitted. The driving transistor and the at least one switching transistor may be thin-film transistors. The light-emitting element may emit light in proportion to the driving current from the driving transistor. The light-emitting element may be an organic light-emitting diode including a first electrode, an organic emissive layer, and a second electrode. The capacitor can keep the data voltage applied to the gate electrode of the driving transistor constant (e.g., substantially constant).

The non-display area NDA may be defined as the area from the outer side (e.g., outer edge) of the display area DPA to the outer edge of the display panel 10. The scan driver SDR for applying scan signals to the scan lines SCL may be at one side of the non-display area NDA. In addition, a pad area PDA may be at the upper side and the lower side of the non-display area NDA, as shown in FIG. 2 (e.g., at the first non-display area NDA1 and at the second non-display area NDA2, as shown in FIG. 1). The pad area PDA may include a plurality of pads WPD electrically connected to the lines on the display panel 10.

The scan line SCL and the sensing signal line SSL may be extended in the first direction DR1. The scan line SCL and the sensing signal line SSL may be connected to the scan driver SDR. The scan driver SDR may include a driving circuit. The scan driver SDR may be at the third non-display area NDA3 on the display panel 10, but embodiments of the present disclosure are not limited thereto. For example, the scan driver SDR may be in a fourth non-display area NDA4 or in both the third non-display area NDA3 and the fourth non-display area NDA4. The scan driver SDR may be connected to a signal connection wiring CWL. At least one end of the signal connection wiring CWL may include a pad WPD_CW on the first non-display area NDA1 and/or the second non-display area NDA2. The connection wiring CWL may be connected to an external device EXD.

The data line DTL and the reference voltage line RVL may be extended in the second direction DR2 crossing the first direction DR1. A first supply voltage line ELVDL may include a portion extending in the second direction DR2. The first supply voltage line ELVDL may further include a portion extending in the first direction DR1. The first supply voltage line ELVDL may have, but is not limited to, a mesh structure. A second supply voltage line ELVSL may be on the display panel 10.

The pads WPD may be at least at one end of the data line DTL, the reference voltage line RVL, and the first supply voltage line ELVDL. Each of the pads WPD may be in the pad area PDA of the non-display area NDA. According to some embodiments of the present disclosure, a pad WPD_DT of the data line DTL (hereinafter, referred to as a data pad) may be at the pad area PDA at the lower side of the non-display area NDA (e.g., at the first non-display area NDA1). A pad WPD_RV of the reference voltage line RVL (hereinafter referred to as a reference voltage pad) and a pad WPD_ELVD of the first supply voltage line ELVDL (hereinafter referred to as a first supply voltage pad) may be at the pad area PDA at the upper side of the non-display area NDA (e.g., at the second non-display area NDA2). As another example, the data pad WPD_DT, the reference voltage pad WPD_RV and the first supply voltage pad WPD_ELVD may all be at the same area, such as, for example, at the pad area PDA at the lower side of the non-display area NDA (e.g., at the first non-display area NDA1). The external device EXD may be mounted on each of the pads WPD. The external device EXD may be mounted on a pad WPD by way of, for example, an anisotropic conductive film, ultrasonic bonding, etc.

Each of the pixels PX of the display panel 10 includes a pixel driving circuit. The above-described lines may pass through (e.g., may be connected to) each of the pixels PX or the periphery thereof to apply a driving signal to the pixel driving circuit. The pixel driving circuit may include a transistor and a capacitor. The numbers of transistors and capacitors of each pixel driving circuit may vary. In some of the following described embodiments, the pixel driving circuit has a 3T1C structure including three transistors and one capacitor. However, embodiments of the present disclosure are not limited thereto. For example, embodiments of the pixel driving circuit may have a 2T1C structure, a 7T1C structure, a 6T1C structure, or any other suitable structure.

Figure 3:
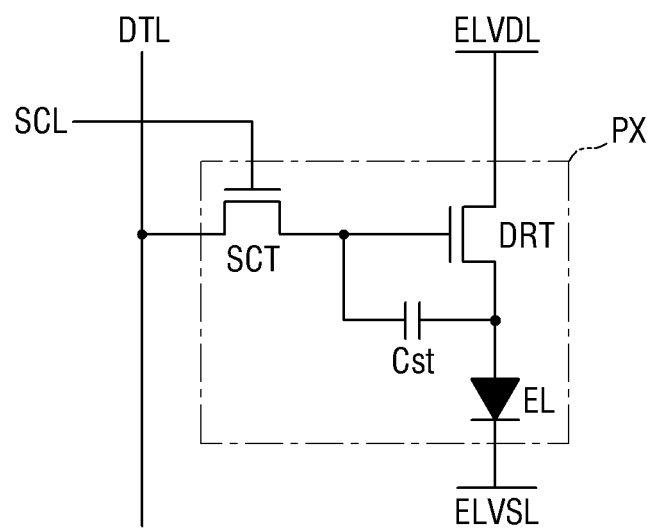
FIG. 3 is an equivalent circuit diagram of one of the pixels of FIG. 2.

FIG. 3 is a circuit diagram of one of the pixels of FIG. 2, according to some embodiments.

Referring to FIG. 3, the pixel PX may include a driving transistor DRT, a switching transistor SCT, a light-emitting element EL, and a capacitor Cst. Although FIG. 3 shows that the pixel PX has a 2T1C structure having one driving transistor DRT, one switching transistor SCT, and one capacitor Cst, embodiments of the present disclosure are not limited thereto. The pixel PX may include any suitable number of transistors (e.g., more than two transistors) and any suitable number of capacitors (e.g., more than one capacitor).

Each of the driving transistor DRT and the switching transistor SCT may include a first electrode, a second electrode, and a gate electrode. One selected from the first electrode and the second electrode may be a source electrode and the other may be a drain electrode.

Each of the driving transistor DRT and the switching transistor SCT may be implemented as a thin-film transistor. Although FIG. 3 shows that each of the driving transistor DRT and the switching transistor SCT is an n-type metal oxide semiconductor field effect transistor (MOSFET), embodiments of the present disclosure are not limited thereto. The driving transistor DRT and the switching transistor SCT may be a p-type MOSFET. In some such embodiments, the positions of the source electrode and the drain electrode of each of the driving transistor DRT and the switching transistor SCT may be changed. In the following description, the driving transistor DRT and the switching transistor are employed as (e.g., assumed to be) n-type MOSFETs.

When the data voltage is applied to the gate electrode, the driving transistor DRT may supply a driving current to the light-emitting element EL, so that light can be emitted. Therefore, the driving transistor DRT may be a driving transistor. The gate electrode of the driving transistor DRT may be connected to the source electrode of the switching transistor SCT, the source electrode of the driving transistor DRT may be connected to a first electrode of the light-emitting element EL, and the drain electrode of the driving transistor DRT may be connected to the first supply voltage line ELVDL from which a first supply voltage is applied.

The switching transistor SCT is turned on in response to a scan signal from a scan line SCL, such that the data voltage from the data line DTL may be applied to the gate electrode of the driving transistor DRT. Therefore, the switching transistor SCT may be a switching transistor. The gate electrode of the switching transistor SCT may be connected to the scan line SCL, the source electrode of the switching transistor SCT may be connected to the gate electrode of the driving transistor DRT, and the drain electrode of the switching transistor SCT may be connected to the data line DTL.

The capacitor Cst may be connected between the gate electrode and the source electrode of the driving transistor DRT. Accordingly, the capacitor Cst can keep the data voltage applied to the gate electrode of the driving transistor DRT constant (e.g., substantially constant).

The light-emitting element EL may emit light in proportion to the driving current from the driving transistor DRT. The light-emitting element EL may be an organic light-emitting diode including a first electrode, an organic emissive layer, and a second electrode. The first electrode of the light-emitting element EL may be connected to the source electrode of the driving transistor DRT, and the second electrode may be connected to the second supply voltage line ELVSL from which a second supply voltage lower than the first supply voltage is applied.

Figure 4:
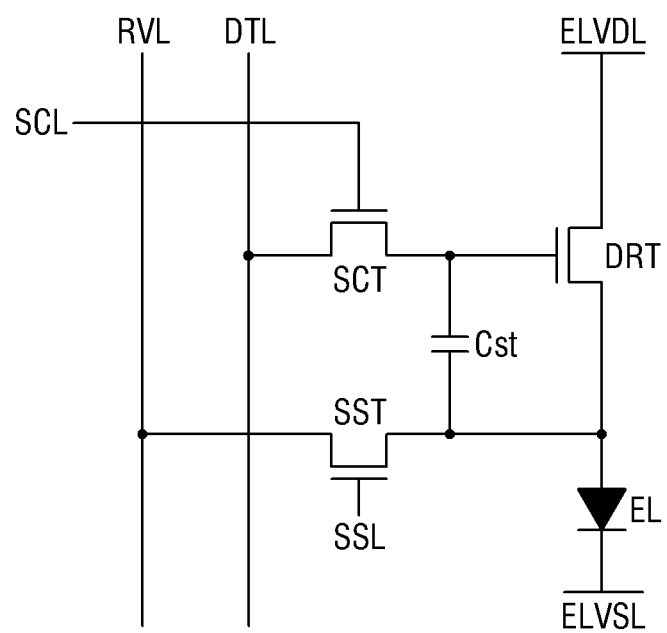
FIG. 4 is an equivalent circuit diagram showing one of the pixels of FIG. 2.

FIG. 4 is a circuit diagram showing one of the pixels of FIG. 2, according to some embodiments.

Referring to FIG. 4, a pixel PX may include a driving transistor DRT, a switching transistor SCT, a sensing transistor SST, a light-emitting element EL, and a capacitor Cst. Some embodiments of the pixel PX shown in FIG. 4 have a 3T1C structure having one driving transistor DRT, one switching transistor SCT, one sensing transistor SST and one capacitor Cst.

The circuit shown in FIG. 4, according to some embodiments, may further include a compensation circuit including the sensing transistor SST and the reference voltage line RVL. The compensation circuit compensates for a threshold voltage of the driving transistor DRT, which is a driving transistor.

The sensing transistor SST may be connected between the source electrode of the driving transistor DRT and the first electrode of the light-emitting element EL. The gate electrode of the sensing transistor SST may be connected to a sensing signal line SSL, the drain electrode of the sensing transistor SST may be connected to the reference voltage line RVL, and the source electrode of the sensing transistor SST may be connected to one end of the capacitor Cst. The sensing transistor SST is turned on by a sensing signal of the sensing signal line SSL and either supplies a reference voltage through the reference voltage line RVL to the source electrode of the driving transistor DRT, or senses the voltage or current at (e.g., from) the source electrode of the driving transistor DRT.

The reference voltage line RVL may be connected to the scan driver SDR. The scan driver SDR may sense the source electrode of the driving transistor DRT of each pixel PX in real time, during a non-display period of an image or n frames, where n is an integer of 1 or greater. For example, the scan driver SDR may sense the source electrode of the driving transistor DRT of each pixel PX at the same time (e.g., substantially the same time) that the pixel experiences the non-display period or displays n frames of an image. The switching transistor SCT and the sensing transistor SST may be turned on at the same time. In some embodiments, the sensing operation through the reference voltage line RVL and the data output operation for outputting a data signal are separated (e.g., separated in time) from each other according to a time division scheme of the scan driver SDR.

A digital data signal, an analog data signal, or a gamma may be compensated depending on the sensing results. In addition, the compensation circuit for generating a compensation signal based on the sensing results may be implemented in the scan driver SDR, in the timing controller, or as a separate circuit.

However, embodiments of the present disclosure are not limited thereto. For example, although the pixels PX described with reference to FIGS. 3 and 4 have 2T1C and 3T1C structures, respectively, the pixels PX of other embodiments may include a greater number of transistors or capacitors.

Hereinafter, the structure and arrangement of the transistors in each of the pixels PX will be described in more detail.

Figure 5:
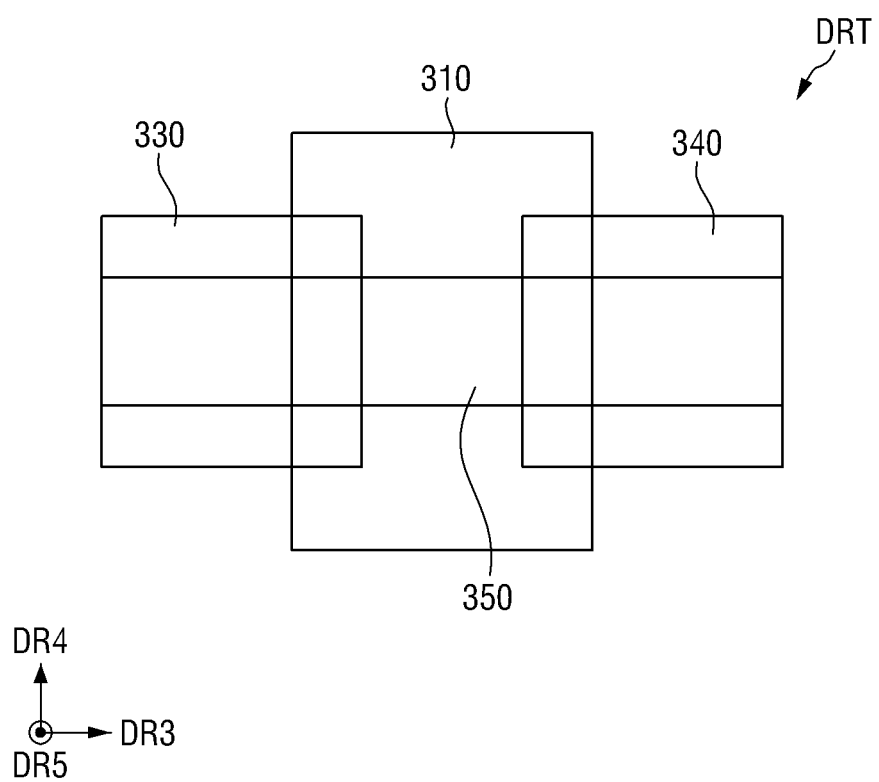
FIG. 5 is a plan view illustrating a driving transistor according to some embodiments of the present disclosure.
Figure 6:
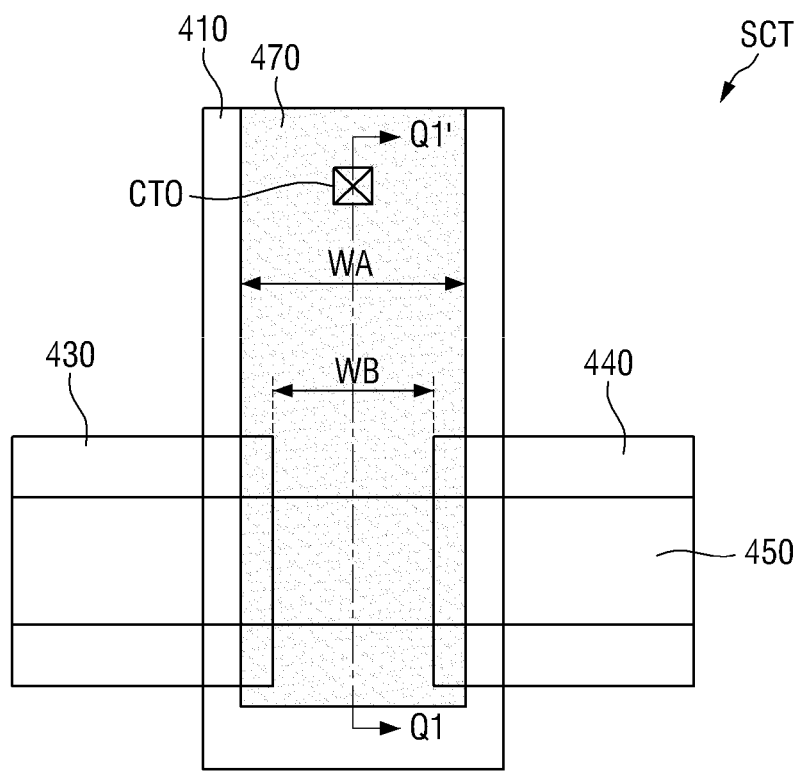
FIG. 6 is a plan view showing a switching transistor according to some embodiments of the present disclosure.
Figure 7:
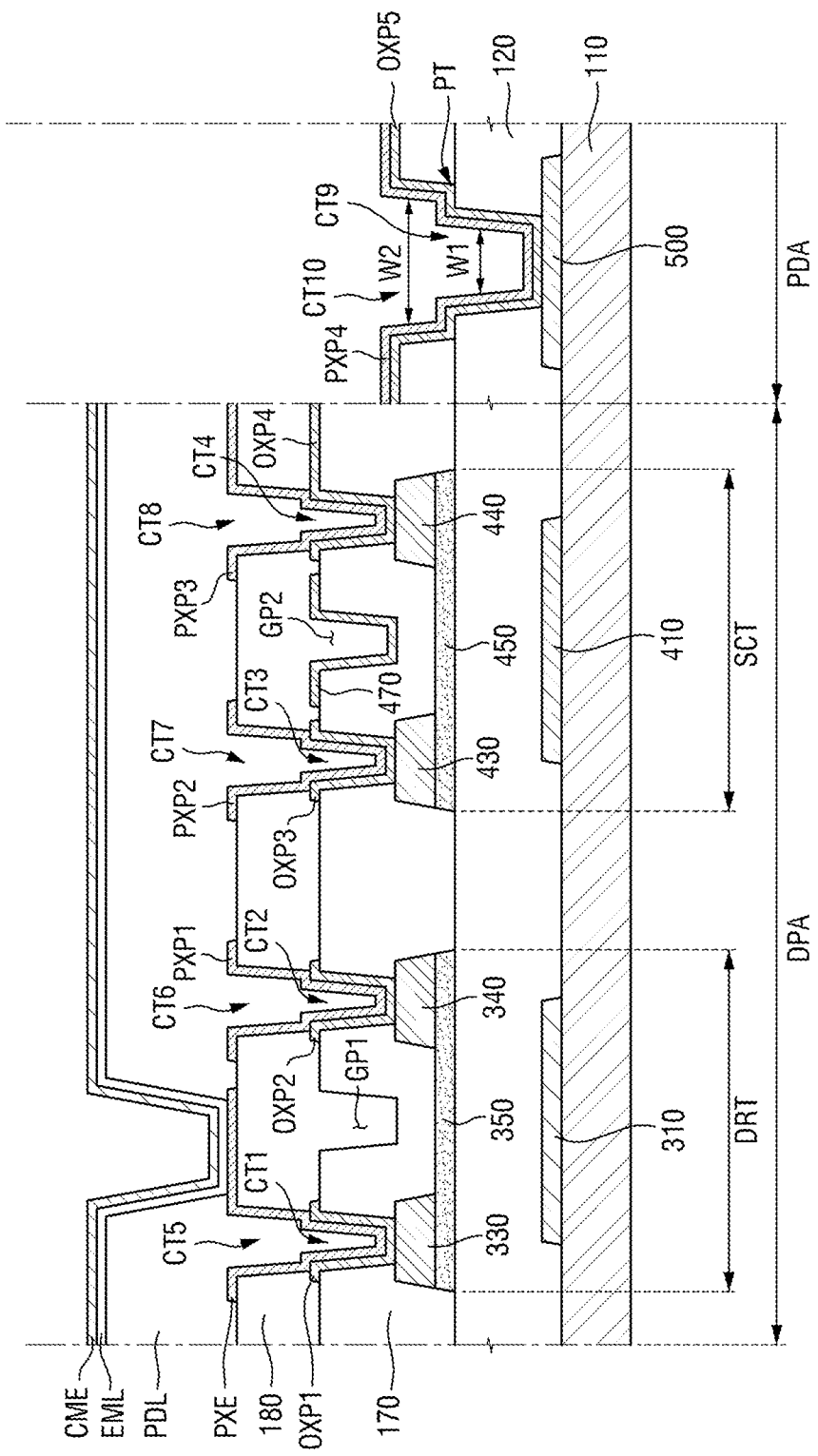
FIG. 7 is a cross-sectional view of a display device according to some embodiments of the present disclosure.

FIG. 5 is a plan view illustrating a driving transistor according to some embodiments of the present disclosure. FIG. 6 is a plan view showing a switching transistor according to some embodiments of the present disclosure. FIG. 7 is a cross-sectional view of a display device according to some embodiments of the present disclosure.

FIG. 7 shows cross sections of a portion of the display area DPA as well as a portion of the pad area PDA of the non-display area NDA. The cross section of the display area DPA shows the cross section of the driving transistor DRT and the switching transistor SCT of each pixel PX.

Referring to FIGS. 5 to 7, the display device 1 may include a plurality of conductive layers and a plurality of semiconductor layers. The display device 1 includes a first substrate 110, a buffer layer 120, a first protective layer 170, a first planarization layer 180, a first electrode PXE, an organic emission layer EML, a second electrode CME, and a pixel-defining layer PDL. In addition, the display device 1 includes a first conductive layer, a first semiconductor layer, a second conductive layer, a second semiconductor layer, and a third conductive layer as the plurality of conductive layers and the plurality of semiconductor layers. The conductive layers and the semiconductor layers may include a driving transistor DRT and a switching transistor SCT.

According to some embodiments of the present disclosure, the display device 1 may include a driving transistor DRT and a switching transistor SCT having a bottom-gate structure (e.g., arrangement), where a gate electrode is under an active layer. As shown in FIGS. 5 to 7, in the driving transistor DRT and the switching transistor SCT, gate electrodes 310 and 410 are below active layers 350 and 450, respectively. At least one selected from the driving transistor DRT and the switching transistor SCT may further include an oxide layer on the active layer 350 or 450. In some embodiments where the driving transistor DRT and the switching transistor SCT of the display device 1 have the bottom-gate structure and further include the oxide layer, excellent device characteristics can be obtained.

Figure 27:
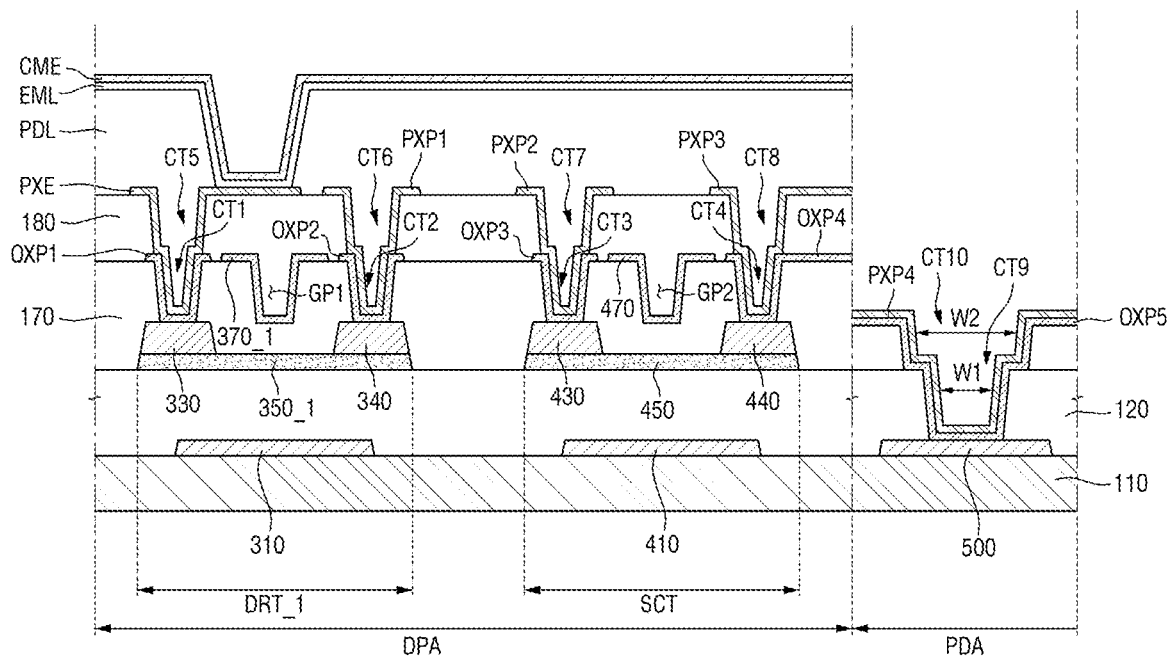
FIG. 27 is a cross-sectional view showing a display device including the driving transistor of FIG. 26 according to some embodiments of the present disclosure.

According to some embodiments of the present disclosure, the driving transistor DRT may include a first gate electrode 310, a first active layer 350, a first source electrode 330, and a first drain electrode 340. The switching transistor SCT may include a second gate electrode 410, a second active layer 450, a second source electrode 430, a second drain electrode 440, and a second oxide layer 470. At least one selected from the driving transistor DRT and the switching transistor SCT includes an oxide layer on the active layer. Although FIG. 7 shows that only the switching transistor SCT includes the second oxide layer 470, embodiments of the present disclosure are not limited thereto. For example, the driving transistor DRT may also include a first oxide layer 370, as shown in FIG. 27. Hereinafter, the driving transistor DRT and the switching transistor SCT will be described in more detail.

The first substrate 110 may include a region where the driving transistor DRT and the switching transistor SCT are included. The first substrate 110 may include plastic or glass.

The first conductive layer is on the first substrate 110. The first conductive layer includes a first gate electrode 310 of the driving transistor DRT, a second gate electrode 410 of the switching transistor SCT, and a pad electrode 500 of the pad area PDA. The above-described scan line SCL and the sensing signal line SSL may also be included in the first conductive layer.

The first gate electrode 310 may overlap a portion of the first active layer 350 with a buffer layer 120 therebetween. The second gate electrode 410 may overlap a portion of the second active layer 450 with the buffer layer 120 therebetween. For example, as shown in the drawings, the first gate electrode 310 and the second gate electrode 410 may have a smaller width than the first active layer 350 and the second active layer 450, respectively. For example, the width of the first gate electrode 310 measured in one direction may be smaller than the width of the first active layer 350 measured in the one direction, and the width of the second gate electrode 410 measured in the one direction may be smaller than the width of the second active layer 450 measured in the one direction. However, embodiments of the present disclosure are not limited thereto.

The pad electrode 500 may be in the pad area PDA, and a hole (e.g., contact hole CT9) in (e.g., penetrating through) the buffer layer 120 may expose a portion of the upper surface of the pad electrode 500. A second semiconductor layer or a third conductive layer, which will be described later, may be on the exposed pad electrode 500 and may be in contact with the pad electrode 500. As used herein, the term "in contact with" may refer to direct contact (e.g., physical contact). An external device EXD may be mounted on the pad electrode 500.

The first conductive layer may include a single layer or multiple layers of one selected from molybdenum (Mo), aluminum (Al), chromium (Cr), gold (Au), titanium (Ti), nickel (Ni), neodymium (Nd), copper (Cu), and an alloy thereof. However, embodiments of the present disclosure are not limited thereto.

A buffer layer 120 is on (e.g., covers) the first conductive layer. The buffer layer 120 may be over (e.g., cover) the first gate electrode 310, the second gate electrode 410, and the pad electrode 500. However, in some embodiments, the buffer layer 120 may expose a portion of the upper surface of the pad electrode 500. The buffer layer 120 can protect the driving transistor DRT and the switching transistor SCT of the pixel PX from moisture permeating through (e.g., penetrating through) the first substrate 110. A ninth contact hole CT9 may penetrate through the portion of the buffer layer 120 that is in the pad area PDA, and may expose a portion of the upper surface of the pad electrode 500. The pad electrode 500 may be in contact with a portion of the second semiconductor layer through the ninth contact hole CT9.

The buffer layer 120 may include a plurality of inorganic layers that are alternately stacked on one another. For example, the buffer layer 120 may include multiple layers, where one or more inorganic layers selected from a silicon oxide layer (SiOx), a silicon nitride layer (SiNx) and a silicon oxynitride layer (SiON) are alternately stacked on one another.

The first semiconductor layer is on the buffer layer 120. The first semiconductor layer may include the first active layer 350 and the second active layer 450 on the buffer layer 120 in the display area DPA. The first active layer 350 and the second active layer 450 may include (e.g., be) the active layer of the driving transistor DRT and the switching transistor SCT, respectively. The first active layer 350 may be on the buffer layer 120 above the first gate electrode 310, and the second active layer 450 may be on the buffer layer 120 above the second gate electrode 410. Because the display device 1, according to some embodiments, has a bottom-gate structure (e.g., arrangement) in which the gate electrodes of the driving transistor DRT and the switching transistor SCT are under the active layers, the number of masks used during the process of fabricating the display device 1 may be reduced.

The first semiconductor layer may not be above (e.g., may not overlap) the pad electrode 500 in the pad area PDA. The second semiconductor layer or the third conductive layer may be on the pad electrode 500.

The first semiconductor layer may include an oxide semiconductor. In some embodiments, the first active layer 350 and the second active layer 450 may include an oxide semiconductor. For example, the oxide semiconductor of the first active layer 350 and the second active layer 450 may include at least one selected from indium (In), gallium (Ga), zinc (Zn), tin (Sn), and hafnium (Hf). In some embodiments, the oxide semiconductor may include indium-tin oxide (ITO), indium-gallium-tin oxide (ITGO), indium-gallium-zinc oxide (IGZO) or indium-gallium-zinc-tin oxide (IGZTO). However, embodiments of the present disclosure are not limited thereto.

The second conductive layer is on the first semiconductor layer. The second conductive layer may include source electrodes and drain electrodes. For example, the second conductive layer may include the first source electrode 330 and the first drain electrode 340 of the driving transistor DRT, and the second source electrode 430 and the second drain electrode 440 of the switching transistor SCT. The second conductive layer may further include the data line DTL and supply voltage lines ELVDL and ELVSL.

The first source electrode 330 and the first drain electrode 340 are on the first active layer 350. The first source electrode 330 may be in contact with one side of the first active layer 350, while the first drain electrode 340 may be in contact with the other side of the first active layer 350. For example, one side of the first source electrode 330 may be generally aligned with one side of the first active layer 350, while one side of the first drain electrode 340 may be generally aligned with the other side of the first active layer 350. For example, as shown in FIG. 7, one side (e.g., the left side) of the first source electrode 330 may be aligned with the one side (e.g., the left side) of the first active layer 350, while one side (e.g., the right side) of the first drain electrode 340 may be aligned with the other side (e.g., the right side) of the first active layer 350. The other side (e.g., the right side) of the first source electrode 330 and the other side (e.g., the left side) of the first drain electrode 340 may be on the first active layer 350.

Such a structure may be formed (e.g., manufactured) by patterning a portion of the first semiconductor layer and a portion of the second conductive layer via (e.g., by) the same process. However, embodiments of the present disclosure are not limited thereto. For example, in some embodiments, one side of the first source electrode 330 (e.g., the left side, as shown in FIG. 7) may extend beyond one side (e.g., the left side) of the first active layer 350 and one side (e.g., the right side) of the first drain electrode 340 may extend beyond the other side (e.g., the right side) of the first active layer 350 such that the first source electrode 330 and the first drain electrode 340 may be on the buffer layer 120. For example, at least a portion of the lower surface of each of the first source electrode 330 and the first drain electrode 340 may be in contact with (e.g., may be directly on) the buffer layer 120.

The second source electrode 430 and the second drain electrode 440 are on the second active layer 450. The second source electrode 430 may be in contact with one side of the second active layer 450, while the second drain electrode 440 may be in contact with the other side of the second active layer 450. For example, one side (e.g., the left side) of the second source electrode 430 may be generally aligned with one side (e.g., the left side) of the second active layer 450, while one side (e.g., the right side) of the second drain electrode 440 may be generally aligned with the other side (e.g., the right side) of the second active layer 450. The second source electrode 430 and the second drain electrode 440 may be the same or substantially the same as the first source electrode 330 and the first drain electrode 340, respectively, and redundant descriptions thereof will not be repeated here.

In some embodiments, the second conductive layer may not be on the pad electrode 500. The second semiconductor layer or the third conductive layer may be on the pad electrode 500.

The second conductive layer may include a single layer or multiple layers of at least one selected from molybdenum (Mo), aluminum (Al), chromium (Cr), gold (Au), titanium (Ti), nickel (Ni), neodymium (Nd), copper (Cu), and an alloy thereof. However, embodiments of the present disclosure are not limited thereto.

The first protective layer 170 is over (e.g., on) the second conductive layer. The first protective layer 170 may be on the entire surface of the first semiconductor layer and the buffer layer 120, including the second conductive layer. For example, the first protective layer 170 may be on the entire surface of the first semiconductor layer, the buffer layer 120, and the second conductive layer. For example, the first protective layer 170 may cover the first active layer 350, the second active layer 450, and the buffer layer 120, including the first source electrode 330, the first drain electrode 340, the second source electrode 430 and the second drain electrode 440. The first protective layer 170 may be an inorganic material such as, for example, silicon oxide (SiOx) and silicon nitride (SiNx), or a stack structure thereof. Accordingly, the upper surface of the first protective layer 170 may include recesses due to (e.g., caused by) level differences of the first semiconductor layer and the second conductive layer therebelow. For example, the first protective layer 170 may include steps.

According to some embodiments shown in FIG. 7, grooves GP may be in the first protective layer 170 that are recessed due to level differences of the source electrodes 330 and 430 and the drain electrodes 340 and 440 thereunder. Each of the grooves GP may be above the portion of the active layer between the source electrode and the drain electrode spaced apart from each other. The grooves GP may include a first groove GP1 above the first active layer 350 and a second groove GP2 above the second active layer 450. A second semiconductor layer is on the first protective layer 170, and a portion of the second semiconductor layer in the grooves GP may be an oxide layer of the driving transistor DRT or of the switching transistor SCT.

A plurality of contact holes may be in the first protective layer 170. The first protective layer 170 may include a first contact hole CT1 penetrating through the first protective layer 170 to expose a portion of the upper surface of the first source electrode 330, a second contact hole CT2 penetrating through the first protective layer 170 to expose a portion of the upper surface of the first drain electrode 340, a third contact hole CT3 penetrating through the first protective layer 170 to expose a portion of the upper surface of the second source electrode 430, and a fourth contact hole CT4 penetrating through the first protective layer 170 to expose a portion of the upper surface of the second drain electrode 440. The source and drain electrodes of the driving transistor DRT and the switching transistor SCT may be in contact with the second semiconductor layer or the third conductive layer through the first to fourth contact holes CT1, CT2, CT3 and CT4.

The first protective layer 170 may also be in the pad area PDA. The first protective layer 170 may include a tenth contact hole CT10 penetrating through the protective layer 170 to expose a portion of the upper surface of the pad electrode 500. A ninth contact hole CT9 and a tenth contact hole CT10 may be above the pad electrode 500, so that the pad electrode 500 may be in contact with the second semiconductor layer or the third conductive layer through the contact holes.

The ninth contact hole CT9 and the tenth contact hole CT10 may be formed via (e.g., by) different processes. In some embodiments of the present disclosure, a first width W1, which is the width of the ninth contact hole CT9, may be smaller than a second width W2, which is the width of the tenth contact hole CT10. Because the ninth contact hole CT9 has a smaller width than the width of the tenth contact hole CT10, the sidewalls PT of the ninth contact hole CT9 may be more to the inside than the sidewalls of the tenth contact hole CT10. For example, the ninth contact hole CT9 may be centered beneath the center of the tenth contact hole CT10. However, embodiments of the present disclosure are not limited thereto. In some embodiments, the contact holes in the buffer layer 120 and the first protective layer 170 are formed via the same process, so that the sidewalls of the contact holes in the buffer layer 120 may be aligned with those of the first protective layer 170. For example, one side (e.g., the left side) of the ninth contact hole CT9 may be aligned with one side (e.g., the left side) of the tenth contact hole CT10.

The second semiconductor layer may be on the first protective layer 170. The second semiconductor layer may include a plurality of oxide patterns OXP and at least one oxide layer. The oxide layer may be on (e.g., in, covering, etc.) at least one of the grooves GP of the first protective layer 170. For example, the oxide layer may include a second oxide layer 470 on (e.g., in, covering, etc.) the second groove GP2 of the first protective layer 170. The second oxide layer 470 may be above the second active layer 450 and overlap the second active layer 450 in the thickness direction.

The second oxide layer 470 may overlap at least a portion of the second active layer 450 in the thickness direction. In some embodiments of the present disclosure, the second oxide layer 470 may cover (e.g., overlap) at least the portion of the second active layer 450 between the second source electrode 430 and the second drain electrode 440. For example, the width WA of the second oxide layer 470 may be greater than the width WB between the second source electrode 430 and the second drain electrode 440. Accordingly, at least a portion of the second oxide layer 470 may be above the second source electrode 430 and the second drain electrode 440. For example, the second oxide layer 470 may overlap at least a portion of the second source electrode 430 and the second drain electrode 440 in the thickness direction.

The oxide layer may be above the active layer of the switching transistor SCT or the driving transistor DRT, and may inject oxygen into the active layer. In some embodiments, the second oxide layer 470 has a width WA greater than a width WB between the second source electrode 430 and the second drain electrode 440 so that the second oxide layer 470 covers (e.g., overlaps) at least the channel region of the second active layer 450. Although the second oxide layer 470 covers only a portion of the second source electrode 430 and the second drain electrode 440 in some of the drawings, embodiments of the present disclosure are not limited thereto. For example, the second oxide layer 470 may have a larger area.

In addition, the oxide layer may include more oxide layers. For example, the oxide layer may include an oxide layer in the first groove GP1 above the first active layer 350 in the thickness direction. At least one selected from the driving transistor DRT and the switching transistor SCT further includes an oxide layer, thereby improving device characteristics.

The oxide patterns OXP of the second semiconductor layer may be in contact with the second conductive layer. For example, the oxide patterns OXP of the second semiconductor layer may contact the source electrodes and the drain electrodes of the driving transistor DRT and the switching transistor SCT through the contact holes in the first protective layer 170. The oxide patterns OXP may include a first oxide pattern OXP1, a second oxide pattern OXP2, a third oxide pattern OXP3 and a fourth oxide pattern OXP4 in the display area DPA. The oxide patterns OXP may further include a fifth oxide pattern OXP5 in the pad area PDA.

The first oxide pattern OXP1 may be in contact with a portion of the upper surface of the first source electrode 330 through the first contact hole CT1, the second oxide pattern OXP2 may be in contact with a portion of the upper surface of the first drain electrode 340 through the second contact hole CT2, the third oxide pattern OXP3 may be in contact with a portion of the upper surface of the source electrode 430 through the third contact hole CT3, and the fourth oxide pattern OXP4 may be in contact with a portion of the upper surface of the second drain electrode 440 through the fourth contact hole CT4. In addition, the fifth oxide pattern OXP5 may be in contact with a portion of the upper surface of the pad electrode 500 through the ninth contact hole CT9 and the tenth contact hole CT10. Each of the plurality of oxide patterns OXP may be in contact with and cover at least a portion of the upper surface of the second conductive layer, to prevent or reduce the material of the second conductive layer from being damaged during a subsequent process. Because the first planarization layer 180 is not on the first protective layer 170 in the pad area PDA, the pad electrode 500 may be partially exposed during the process of fabricating the display device 1. The oxide patterns OXP may cover the exposed second conductive layer or the first conductive layer to protect them. In addition, the oxide patterns OXP may be electrically connected to the second conductive layer and may serve as bridge lines for connecting them to other lines or elements on another layer.

However, embodiments of the present disclosure are not limited thereto. For example, in some embodiments, the oxide patterns OXP may be eliminated, and the material of the second conductive layer or the first conductive layer may be in contact with the material of the third conductive layer to be protected.

The second semiconductor layer may also include an oxide semiconductor. For example, the oxide layer 470 and the oxide patterns OXP may include an oxide semiconductor. For example, the oxide semiconductor of the oxide layer 470 and the oxide patterns OXP may include at least one selected from indium (In), gallium (Ga), zinc (Zn), tin (Sn), and hafnium (Hf). In some embodiments, the oxide semiconductor may include indium-tin oxide (ITO), indium-gallium-tin oxide (ITGO), indium-gallium-zinc oxide (IGZO), or indium-gallium-zinc-tin oxide (IGZTO). However, embodiments of the present disclosure are not limited thereto.

In some embodiments, the second semiconductor layer may include the same oxide semiconductor as the first semiconductor layer. In some embodiments, the second semiconductor layer and the first semiconductor layer may include oxide semiconductors having different composition ratios.

According to some embodiments of the present disclosure, the oxide layer of the second semiconductor layer may include an oxygen supply layer that injects oxygen into the active layer of the driving transistor DRT or the switching transistor SCT. In the oxide semiconductor, an oxygen vacancy Vo may be partially formed depending on the oxygen partial pressure during the deposition process. When an insulating layer is deposited on the oxide semiconductor, hydrogen (H) may be injected into the oxygen vacancy Vo. Therefore, by disposing (e.g., forming) the oxide layer above the active layer, the oxide layer may supply excess oxygen (O) to another adjacent layer, such as, for example, the insulating layer. The excess oxygen (O) supplied to the insulating layer may be injected into the channel region of the oxide semiconductor, and hydrogen (H) permeated into the oxygen vacancy Vo may be discharged back to the insulating layer. According to some embodiments of the present disclosure, the driving transistor DRT or the switching transistor SCT may include the oxide layer above the active layer to adjust the content of hydrogen or oxygen included in the active layer, thereby improving the device characteristics.

Figure 8:
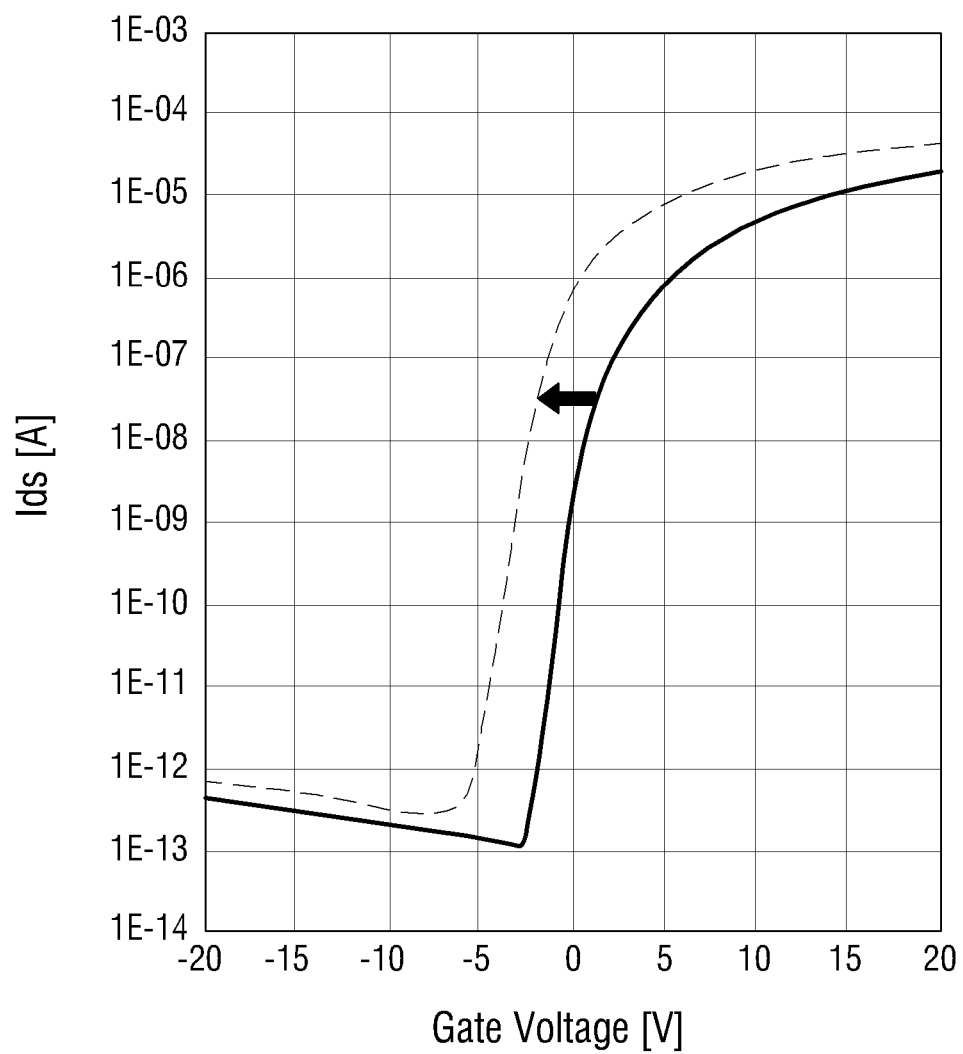
FIGS. 8 to 10 are graphs showing the driving current according to the gate voltage of a switching transistor according to some embodiments of the present disclosure.
Figure 9:
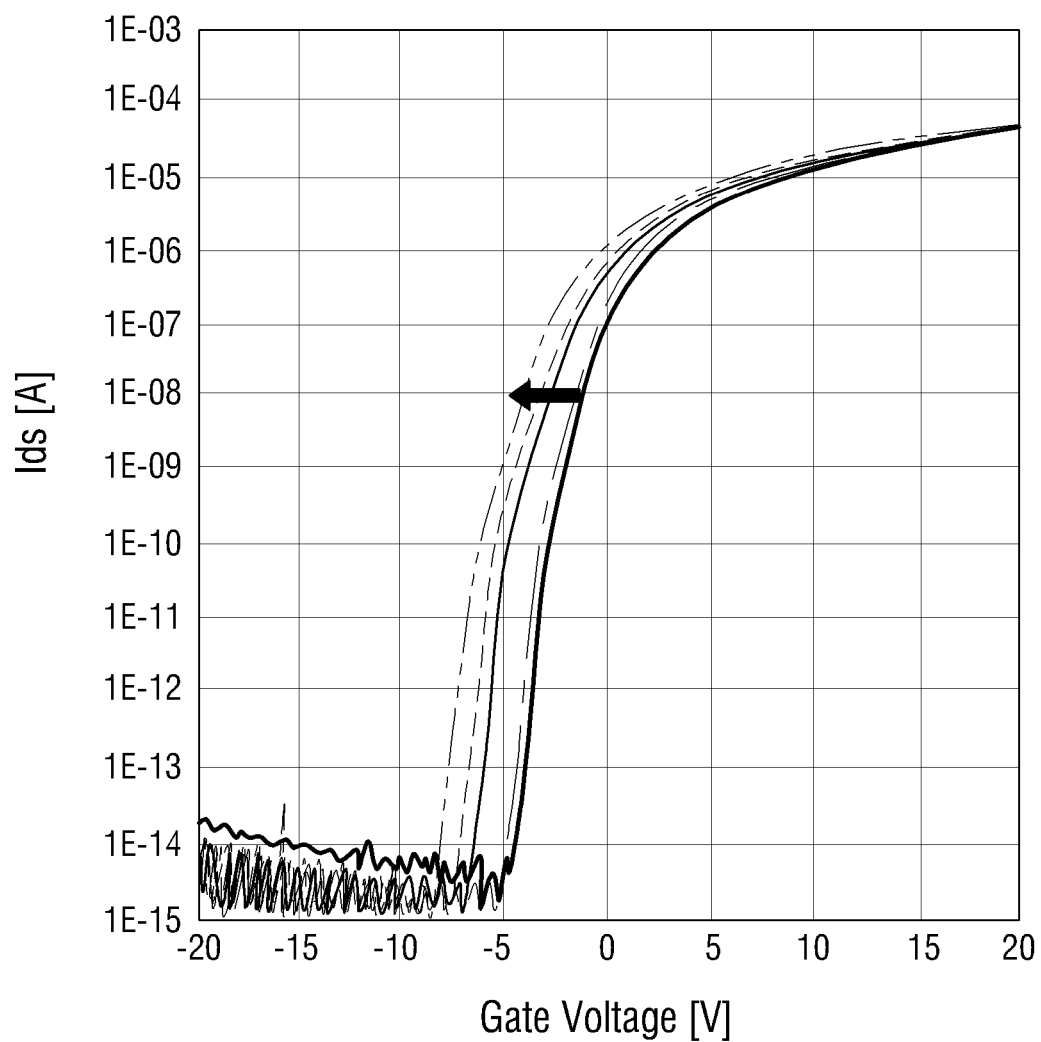
Figure 10:
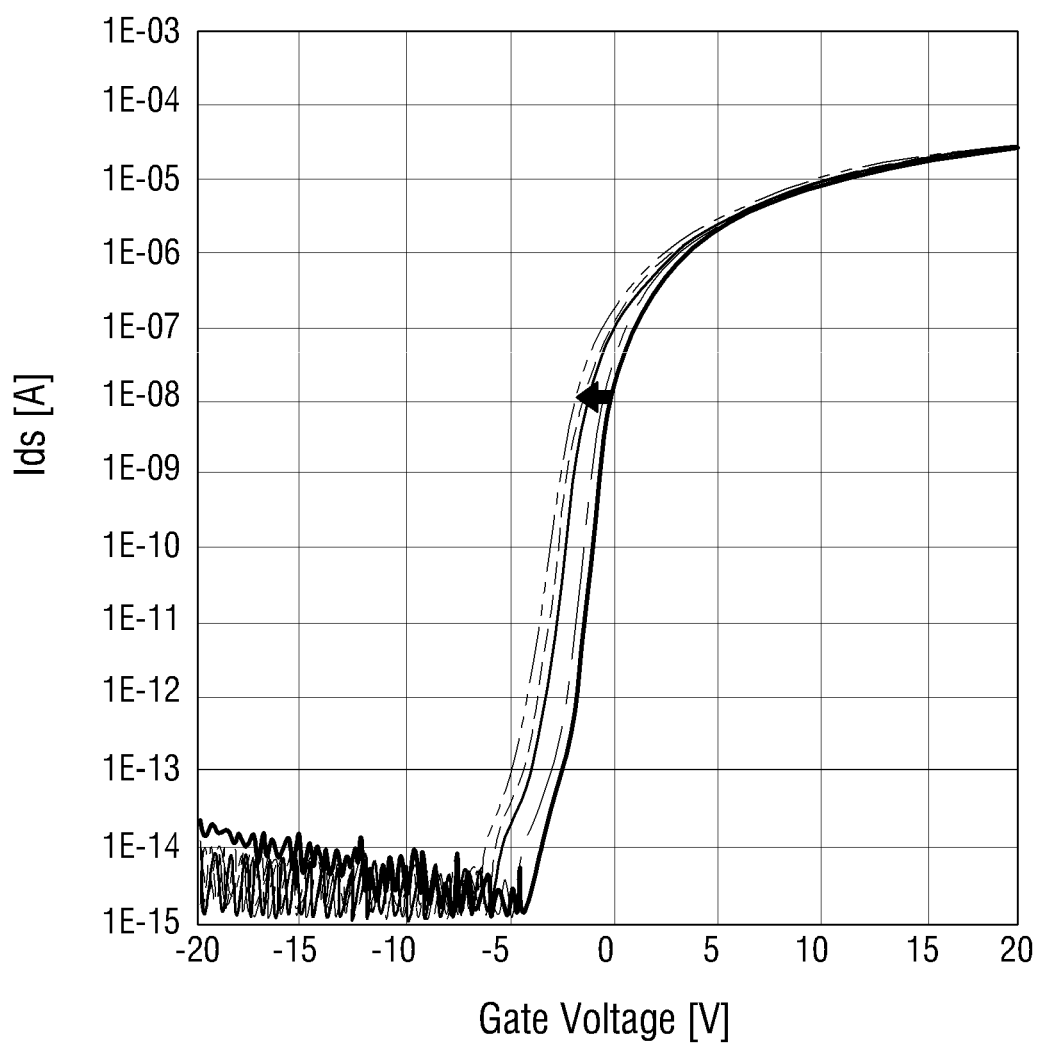

FIGS. 8 to 10 are graphs showing the driving current according to the gate voltage of a switching transistor according to some embodiments.

FIG. 8 is a graph showing driving current Ids according to the gate voltage Vgs of the switching transistor SCT in the initial state. In the graph shown in FIG. 8, the dashed line represents the driving current Ids according to the gate voltage Vgs of a switching transistor SCT including no oxide layer, while the solid line represents the driving current Ids according to the gate voltage Vgs of a switching transistor SCT including an oxide layer. FIGS. 9 and 10 show changes in the driving current Ids after the gate voltage Vgs of the switching transistor SCT has been swept several times. The graph shown in FIG. 9 exhibits the driving current Ids according to the gate voltage Vgs of a switching transistor SCT including no oxide layer. The graph shown in FIG. 10 exhibits the driving current Ids according to the gate voltage Vgs of a switching transistor SCT including an oxide layer.

By disposing (e.g., forming) the oxide layer above the active layer of the switching transistor SCT, the content (e.g., amount, concentration, etc.) of hydrogen (H) introduced from the insulating layer is reduced, and oxygen is supplied, such that the concentration of the oxygen vacancy Vo is also reduced. As a result, it is possible to ensure device reliability (e.g., the device characteristics may be reliable). It can be seen from the graph shown in FIG. 8 that the switching transistor SCT including no oxygen supply layer as the oxide layer (indicated by the dashed line) has a lower threshold voltage Vth on the gate voltage Vgs-driving current Ids curve. In contrast, it can be seen from the graph shown in FIG. 8 that the switching transistor SCT including the oxide layer (indicated by the solid line) has a higher threshold voltage Vth on the gate voltage Vgs-driving current Ids curve. For example, in some embodiments, the switching transistor SCT may exhibit (e.g., have) excellent device characteristics.

In addition, it can be seen from the graphs shown in FIGS. 9 and 10 that the curves of the driving current Ids of the switching transistor SCT including no oxide layer (FIG. 9) are shifted to the left after the gate voltage Vgs has been swept several times (negative shift). In comparison, it can be seen from the graph shown in FIG. 10 that the curves of the driving current Ids of the switching transistor SCT including the oxide layer (FIG. 10) are shifted less to the left after the gate voltage Vgs has been swept several time (negative shift). Therefore, embodiments where the switching transistor SCT includes the oxide layer can ensure excellent device characteristics.

In some embodiments, at least one selected from the driving transistor DRT and the switching transistor SCT includes the oxide layer, so that it is possible to ensure excellent device reliability, even in embodiments where their channel regions have a short length.

In some embodiments, the oxide layer of the second semiconductor layer (e.g., the second oxide layer 470) may be formed in a floating state as it is disposed in the groove GP, unlike the other oxide patterns OXP. However, in some embodiments, because an unnecessary capacitor may be formed between the second oxide layer 470 and another conductive layer, the second oxide layer 470 may be electrically connected to another conductive layer (e.g., the first conductive layer).

Figure 11:
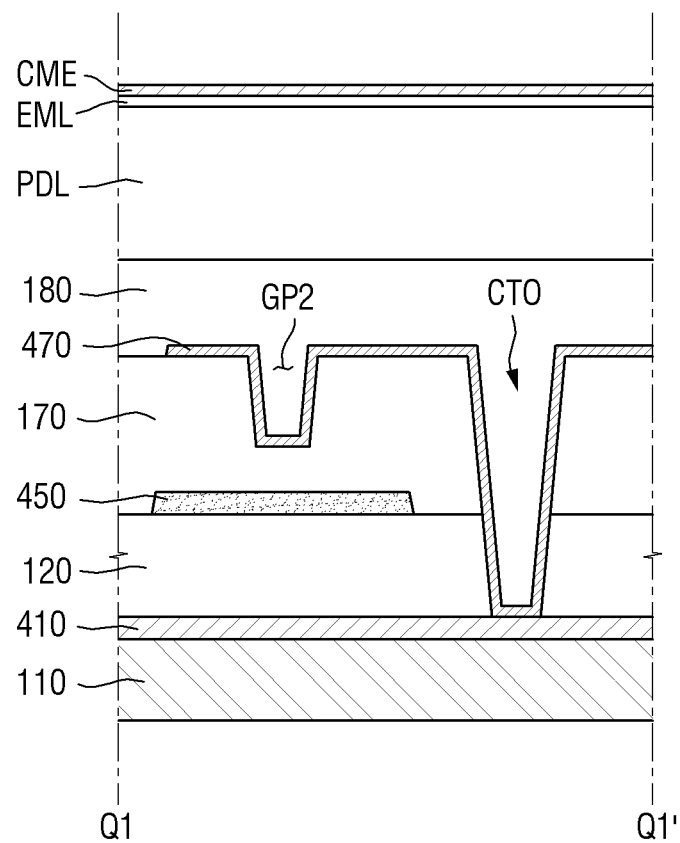
FIG. 11 is a cross-sectional view taken along line Q1-Q1' of FIG. 6.

FIG. 11 is a cross-sectional view taken along line Q1-Q1' of FIG. 6.

Referring to FIGS. 6 and 11, the second oxide layer 470 may pass through the first protective layer 170 and the buffer layer 120 to be in contact with the first conductive layer. For example, the second oxide layer 470 may be in contact with the second gate electrode 410 through a contact hole CTO penetrating through the first protective layer 170 and through the buffer layer 120 to expose a portion of the upper surface of the first conductive layer. Because the second oxide layer 470 is electrically connected to another conductive layer, it is possible to prevent or reduce an unnecessary capacitor between the second active layer 450 and the second oxide layer 470. However, embodiments of the present disclosure are not limited thereto. For example, the oxide layer may be electrically connected to another conductive layer, such as, for example, supply voltage lines ELVDL and ELVSL, to which (e.g., through which) a supply voltage is applied.

Referring back to FIGS. 5 to 7, the first planarization layer 180 is on the first protective layer 170. The first planarization layer 180 may include a flat surface over the level difference formed by (e.g., due to, caused by, etc.) thin-film transistors such as, for example, the driving transistor DRT and the switching transistor SCT. The first planarization layer 180 may be an organic layer such as, for example, an acryl resin, an epoxy resin, a phenolic resin, a polyamide resin and a polyimide resin.

A plurality of contact holes may be in the first planarization layer 180. The contact holes in the first planarization layer 180 may pass through the first planarization layer 180 to expose a portion of the second semiconductor layer. A fifth contact hole CT5, a sixth contact hole CT6, a seventh contact hole CT7 and an eighth contact hole CT8 may be in the first planarization layer 180. The fifth contact hole CT5 may expose a portion of the first oxide pattern OXP1 of the second semiconductor layer, the sixth contact hole CT6 may expose a portion of the second oxide pattern OXP2 of the second semiconductor layer, the seventh contact hole CT7 may expose a portion of the third oxide pattern OXP3 of the second semiconductor layer, and the eighth contact hole CT8 may expose a portion of the fourth oxide pattern OXP4 of the second semiconductor layer. Third conductive layers on the first planarization layer 180 may be in contact with a portion of the second semiconductor layer through the contact holes to be electrically connected to the second conductive layer.

In some embodiments, the fifth to eighth contact holes CT5, CT6, CT7 and CT8 may penetrate through the first planarization layer 180 and the first protective layer 170 to directly expose a portion of the second conductive layer. In some embodiments where some of the contact holes in the first protective layer 170 are omitted, the first planarization layer 180 and the first protective layer 170 may be etched via the same process, such that the fifth to eighth contact holes CT5, CT6, CT7, and CT8 that expose a portion of the second conductive layer may be formed.

The third conductive layer is on the first planarization layer 180 in the display area DPA. The third conductive layer may include a first electrode PXE and a plurality of electrode patterns PXP. The electrode patterns PXP may include a first electrode pattern PXP1, a second electrode pattern PXP2, and a third electrode pattern PXP3. The first electrode PXE and the plurality of electrode patterns PXP may be spaced apart from one another, and may be arranged in line with the contact holes in the first planarization layer 180, respectively.

The first electrode PXE may be in contact with the first oxide pattern OXP1 through the fifth contact hole CT5. Accordingly, the first electrode PXE may be connected to the first source electrode 330 of the driving transistor DRT. The first electrode pattern PXP1 may be in contact with the second oxide pattern OXP2 through the sixth contact hole CT6, the second electrode pattern PXP2 may be in contact with the third oxide pattern OXP3 through the seventh contact hole CT7, and the third electrode pattern PXP3 may be in contact with the fourth oxide pattern OXP4 through the eighth contact hole CT8. The plurality of electrode patterns PXP can prevent or reduce damage to a layer thereunder (e.g., the oxide patterns OXP) or can be electrically connected to such layers to serve as bridge lines.

In addition, the third conductive layer may further include a fourth electrode pattern PXP4 in the pad area PDA. The fourth electrode pattern PXP4 may be in contact with the fifth oxide pattern OXP5 in the pad area PDA. For example, the fourth electrode pattern PXP4 may be in contact with the fifth oxide pattern OXP5 through the tenth contact hole CT10 and through the ninth contact hole CT9.

However, embodiments of the present disclosure are not limited thereto. For example, the plurality of electrode patterns PXP except for the first electrode PXE may be omitted from the third conductive layer.

The light-emitting element EL including the organic emission layer EML and the second electrode CME, and the pixel-defining layer PDL may be further on the first planarization layer 180.

The pixel-defining layer PDL may cover the edge of the first electrode PXE on the first planarization layer 180 in order to separate the pixels from one another. For example, the pixel-defining layer PDL may define the pixels PX. In each of the pixels PX, the first electrode PXE, the organic emission layer EML and the second electrode CME are stacked sequentially so that holes from the first electrode PXE and electrons from the second electrode CME are combined with each other in the organic emission layer EML to emit light.

The organic emission layer EML may be on the first electrode PXE and the pixel-defining layer PDL. The organic emission layer EML may include a hole transporting layer, a light-emitting layer, and an electron transporting layer. In addition, the organic emission layer EML may have a tandem structure (e.g., arrangement) of two or more stacks, in which a charge generating layer may be between the stacks. Although the organic emission layer EML is over the entire display area DPA in the drawings, embodiments of the present disclosure are not limited thereto. In some embodiments, the organic emission layer EML may be partially in line with (e.g., may partially overlap with) the first electrode PXE of each pixel PX.

The second electrode CME may be on the organic emission layer EML. The second electrode CME may be a common layer across the pixels PX.

The light-emitting elements EL may have a top-emission type (e.g., structure or arrangement), in which light exits upwardly. In some embodiments, the first electrode PXE may include a metal material having a high reflectivity such as, for example, a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd), and copper (Cu). In addition, the second electrode CME may include a transparent conductive material (TCP) such as, for example, ITO and IZO that can transmit light, or a semi-transmissive conductive material such as, for example, magnesium (Mg), silver (Ag), and an alloy of magnesium (Mg) and silver (Ag). When the second electrode CME includes a semi-transmissive conductive material, the light extraction efficiency can be increased by using microcavities.

In some embodiments, an encapsulation layer may be on the second electrode CME to prevent or reduce oxygen or moisture from permeating (e.g., penetrating) into layers thereunder, such as, for example, the second electrode CME and the organic emission layer EML. The encapsulation layer may include at least one inorganic layer. The inorganic layer may include at least one selected from silicon nitride, aluminum nitride, zirconium nitride, titanium nitride, hafnium nitride, tantalum nitride, silicon oxide, aluminum oxide, and titanium oxide. In addition, the encapsulation layer may include at least one organic layer in order to prevent or reduce particles from penetrating through the encapsulation layer into layers thereunder, such as, for example, the organic emission layer EML and the second electrode CME. The organic layer may include epoxy, acrylate or urethane acrylate.

In some embodiments, the driving transistor DRT and the switching transistor SCT include an active layer having an oxide semiconductor, and may have a bottom-gate structure (e.g., arrangement) in which a gate electrode is below the active layer. In some embodiments, because the display device 1 includes transistors having the bottom-gate structure, it is possible to reduce the fabricating process steps (e.g., the number of fabricating process steps). In some embodiments, at least one selected from the driving transistor DRT and the switching transistor SCT further includes the oxide layer above the active layer, so that it is possible to ensure the reliability of excellent device characteristics, even in embodiments where the channel regions of the transistors have a short length.

Hereinafter, a method of fabricating the display device 1 including the driving transistor DRT and the switching transistor SCT described above will be described in more detail.

Figure 12:
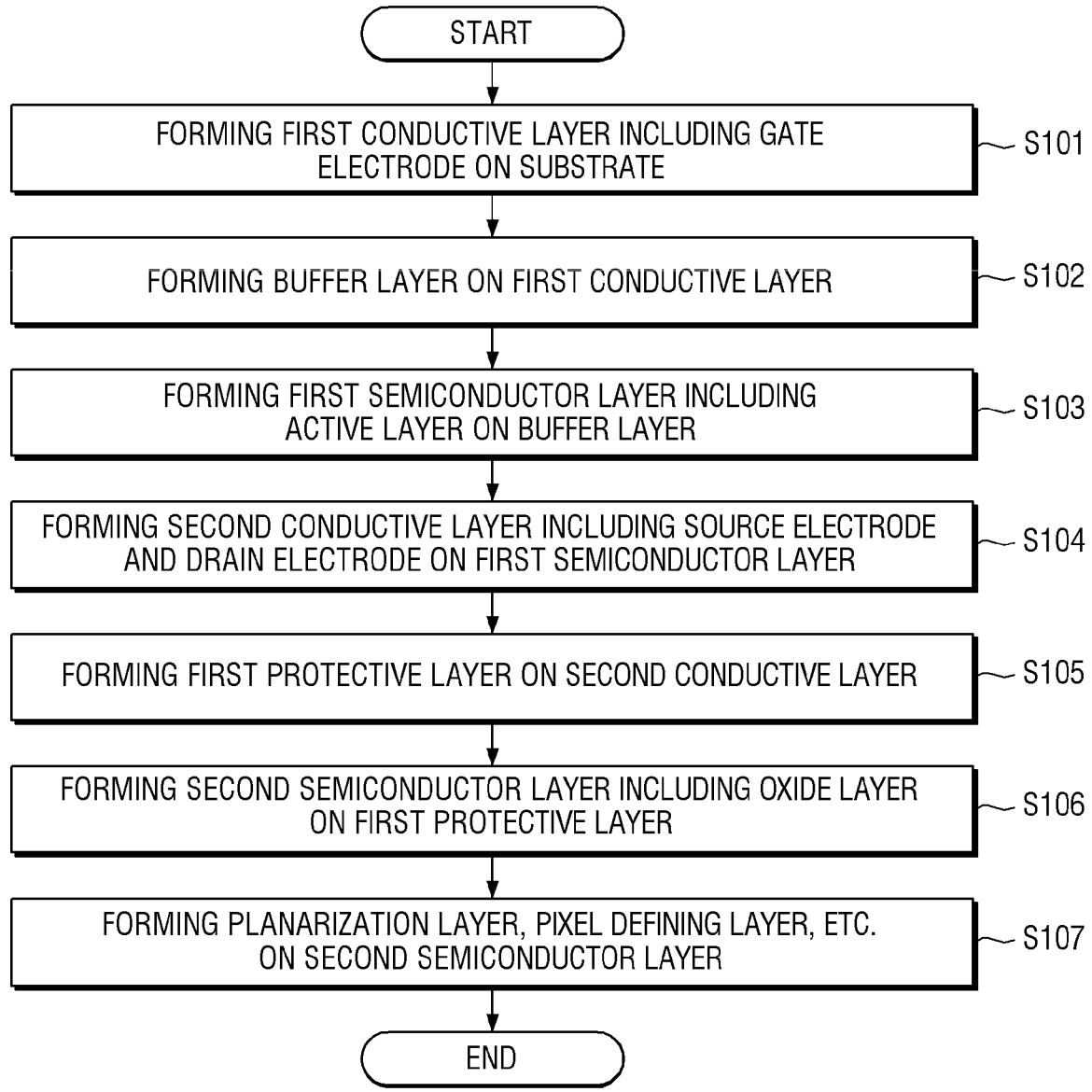
FIG. 12 is a flowchart for illustrating processing steps for fabricating a display device according to some embodiments of the present disclosure.

FIG. 12 is a flowchart illustrating processing steps for fabricating a display device according to some embodiments of the present disclosure.

Referring to FIG. 12, a process of fabricating the display device 1 may include forming a first conductive layer including gate electrodes 310 and 410 on a first substrate 110 (step S101); forming a buffer layer 120 on the first conductive layer (step S102); forming a first semiconductor layer including active layers 350 and 450 on the buffer layer 120 (step S103); forming a second conductive layer including source electrodes 330 and 430 and drain electrodes 430 and 440 on the first semiconductor layer (step S104); forming a first protective layer 170 on the second conductive layer (step S105); forming a second semiconductor layer including an oxide layer 470 on the first protective layer 170 (step S106); and forming a first planarization layer 180, a pixel defining layer PDL, etc. on the second semiconductor layer (step S107).

According to some embodiments of the present disclosure, during the process of fabricating the display device 1, the step of forming the first conductive layer including the gate electrode (S101) may be performed before the step of forming the first semiconductor layer including the active layer (S103). By doing so, the driving transistor DRT and the switching transistor SCT can have a bottom-gate structure in which the gate electrode is under the active layer. In addition, the step of forming the second semiconductor layer including the oxide layer (S106) may be performed after the step of forming the first semiconductor layer including the active layer (S103), so that at least one selected from the driving transistor DRT and the switching transistor SCT may further include an oxide layer. The switching transistor SCT including the oxide layer can exhibit (e.g., have) improved device characteristics and reliability.

Hereinafter, the processing steps of fabricating the display device 1 will be described in more detail with reference to the drawings.

FIGS. 13 to 25 are cross-sectional views showing processing steps of fabricating a display device according to some embodiments of the present disclosure.

Figure 13:
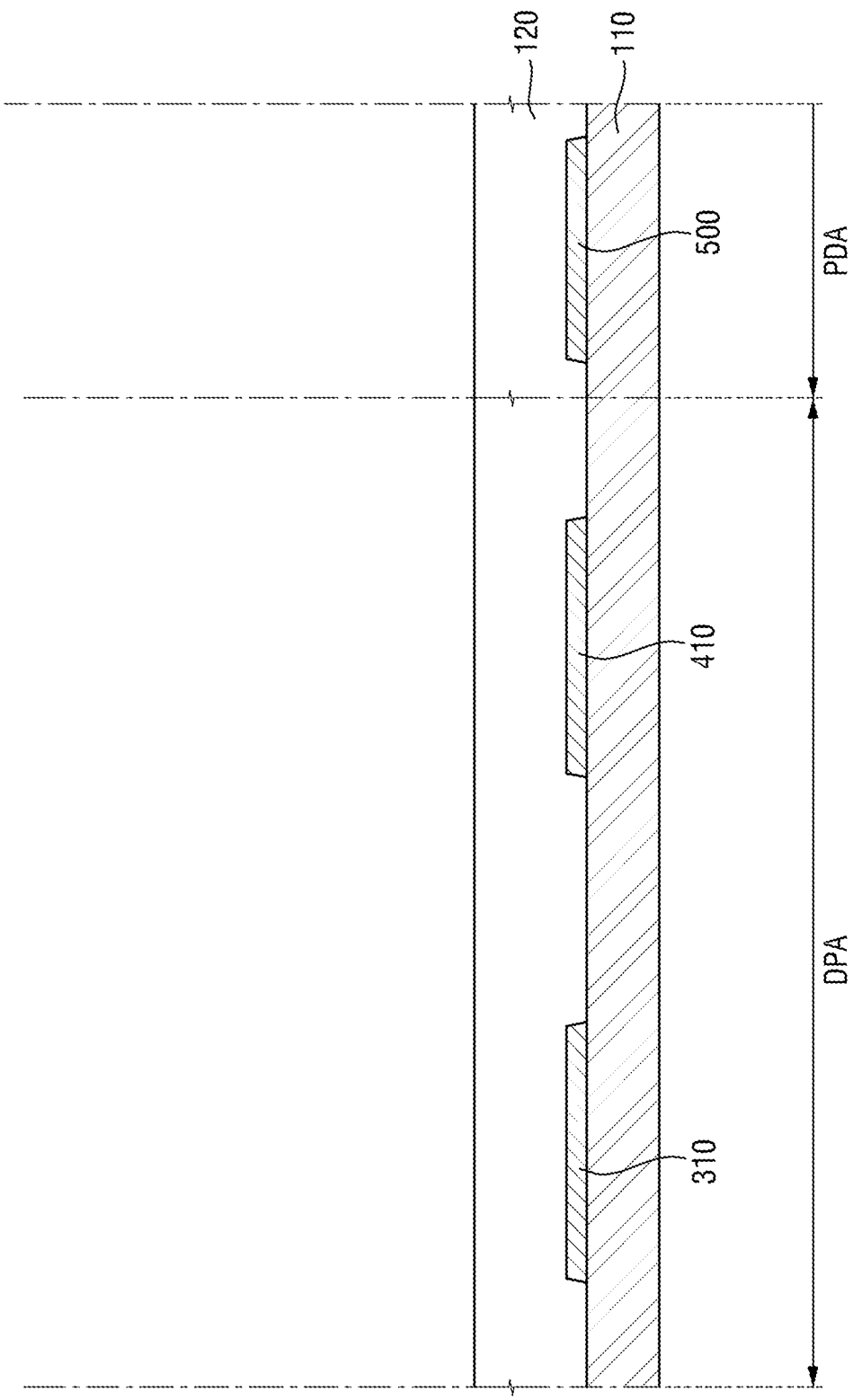
FIGS. 13 to 25 are cross-sectional views showing processing steps of fabricating a display device according to some embodiments of the present disclosure.

Referring to FIG. 13, a first conductive layer including a gate electrode is formed on the first substrate 110 (step S101), and a buffer layer 120 is formed on the first conductive layer (step S102). The first conductive layer may include a first gate electrode 310 and a second gate electrode 410 in the display area DPA, and a pad electrode 500 in the pad area PDA.

The first conductive layer may be formed by forming a metal layer on the first substrate 110 by, for example, sputtering and then patterning the metal layer via an etching process using a photoresist pattern. The buffer layer 120 may be formed by, but is not limited to, chemical vapor deposition. However, embodiments of the present disclosure are not limited thereto. For example, the process for forming the conductive layers, buffer layer, and semiconductor layers may be performed by any process generally available in the related arts. The following description will focus on the formation order and structure of some of the features, while the process for forming them will not be described in more detail.

Figure 14:
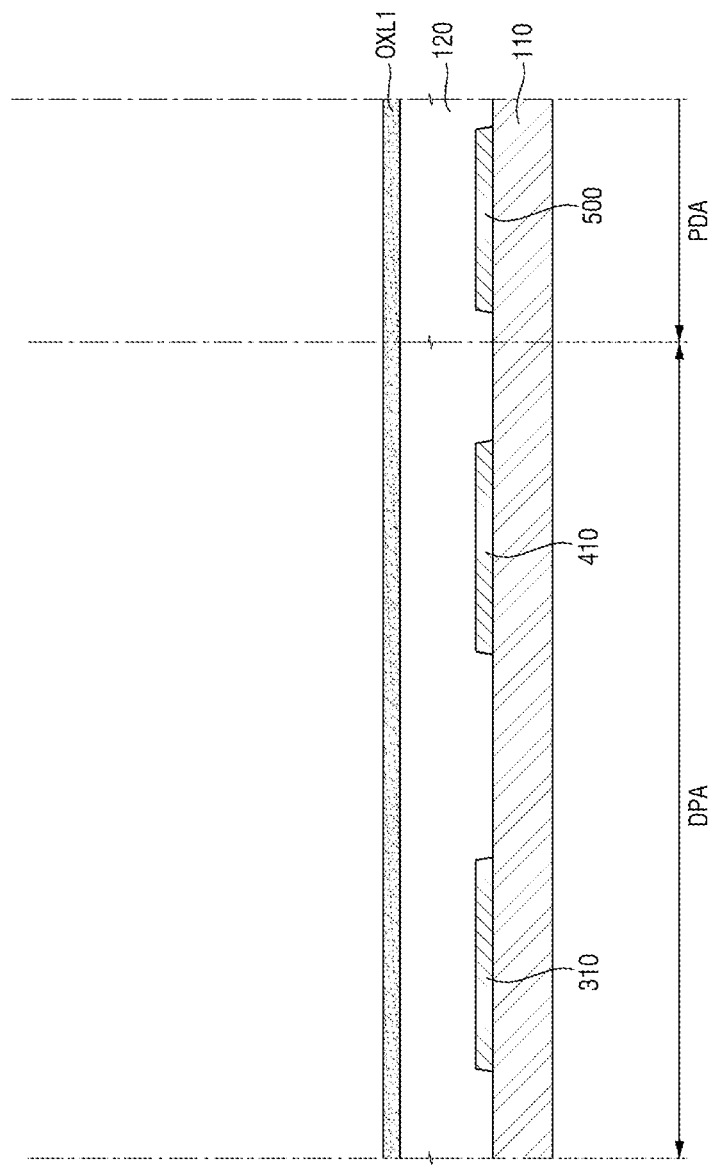
Figure 15:
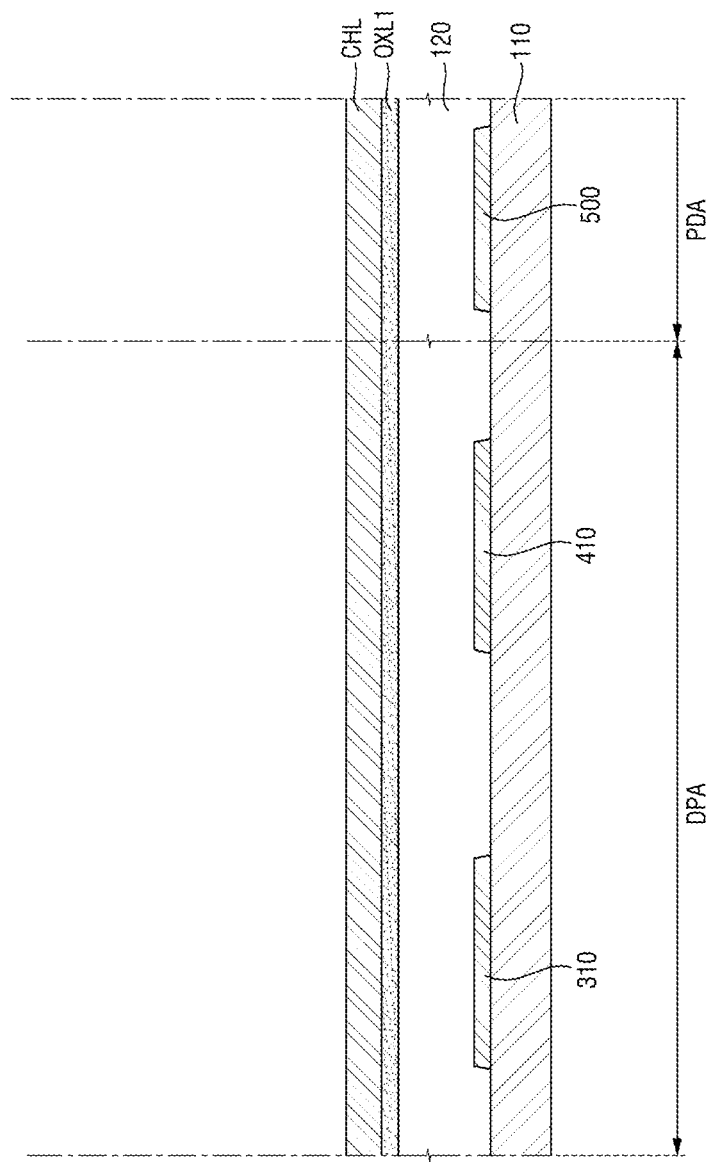

Referring to FIGS. 14 and 15, a first oxide semiconductor layer OXL1 and a first metal layer CHL are formed on the buffer layer 120. The first oxide semiconductor layer OXL1 and the first metal layer CHL may be formed entirely on (e.g., on the entire surface of) the first substrate 110 and the buffer layer 120. The first oxide semiconductor layer OXL1 and the first metal layer CHL may be patterned during a subsequent process to form the active layers 350 and 450, the source electrodes 330 and 430, and the drain electrodes 340 and 440. In some embodiments, the first oxide semiconductor layer OXL1 may be formed by forming a single layer by sputtering, and then performing a patterning process using a photoresist. However, embodiments of the present disclosure are not limited thereto. In some embodiments, it may be formed by atomic layer deposition or any other suitable process generally available.

Figure 16:
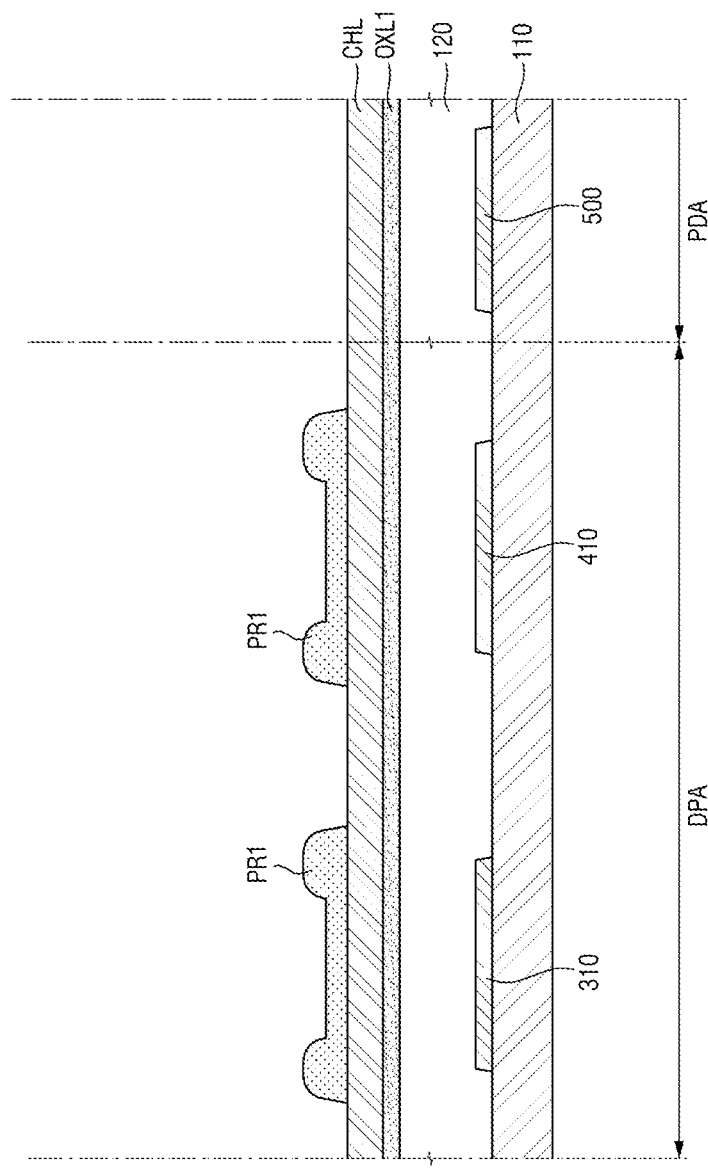
Figure 17:
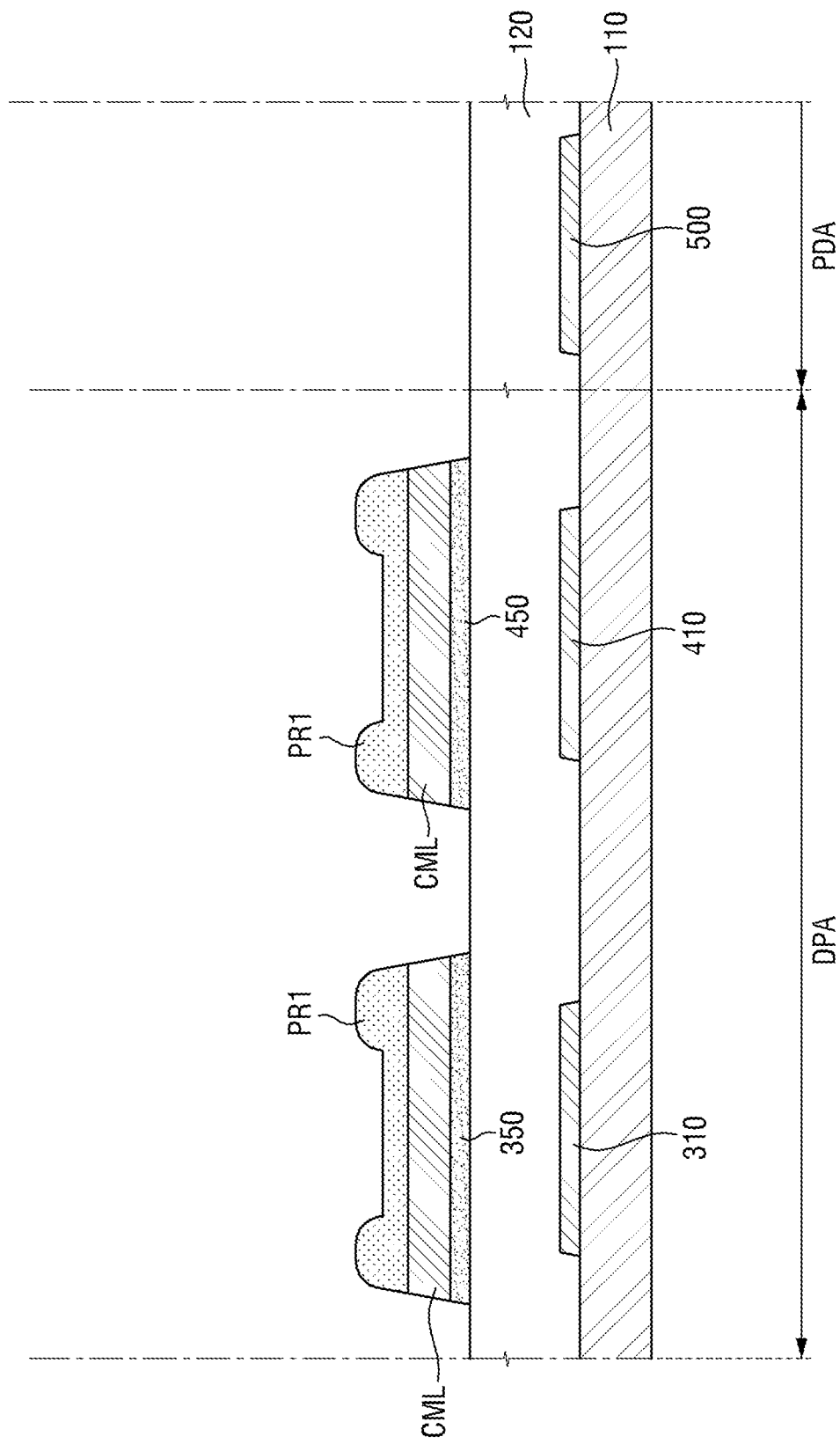

Referring to FIGS. 16 and 17, a first photoresist PR1 is formed on the first metal layer CHL, and the first oxide semiconductor layer OXL1 and the first metal layer CHL are patterned to form a first active layer 350, a second active layer 450, and a second metal layer CML. The second metal layer CML may be patterned during a subsequent process to form a source electrode and a drain electrode.

The first photoresist PR1 may be above the first gate electrode 310 and the second gate electrode 410 in the display area DPA. The first photoresist PR1 may serve as a mask for patterning the first oxide semiconductor layer OXL1 to form the first active layer 350 and the second active layer 450.

Both ends of the first photoresist PR1 may be higher than the center portion. Such a shape of the first photoresist PR1 may be formed, for example, by using a halftone mask. The first photoresist PR1 may serve as a mask for patterning the first metal layer CHL during subsequent processes, and the source electrode and the drain electrode may be simultaneously formed with a single mask. Therefore, the number of masks used during the process of fabricating the display device may be reduced.

Figure 18:
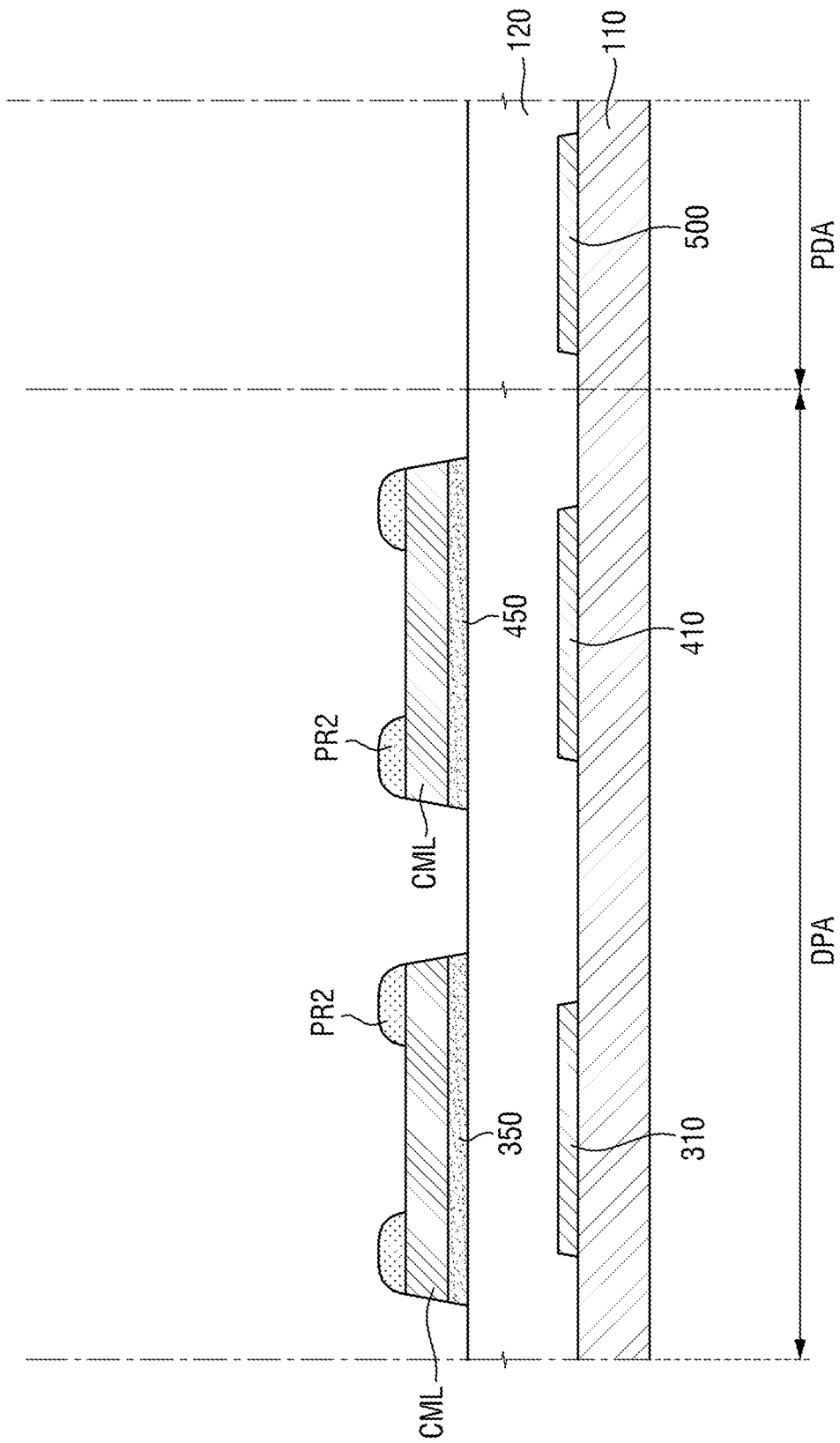
Figure 19:
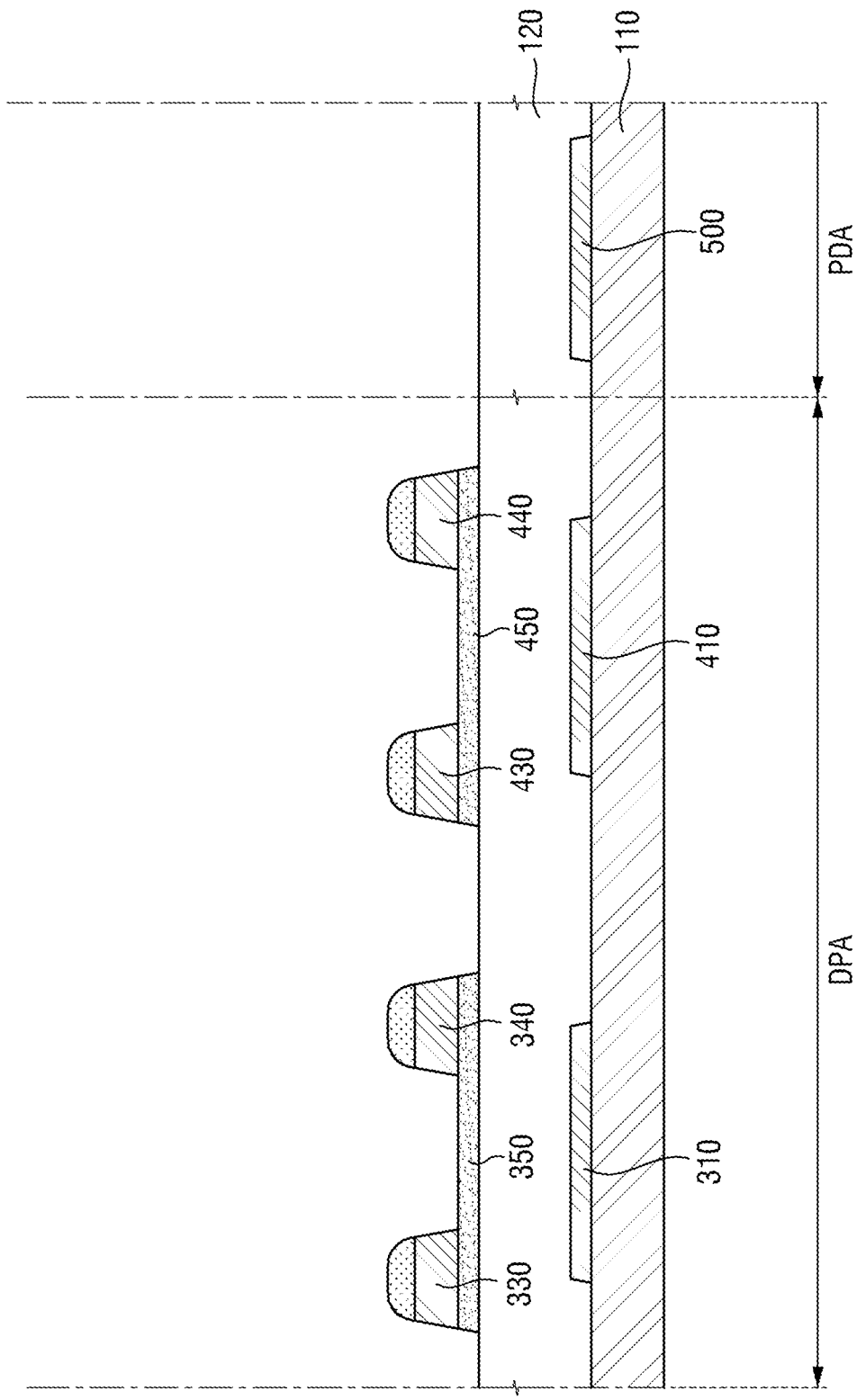

Referring to FIGS. 18 and 19, the first photoresist PR1 is etched to form a second photoresist PR2, and the second metal layer CML is patterned along the second photoresist PR2, such that source and drain electrodes are formed. Because both ends and the center portion of the first photoresist PR1 have different heights, the center portion of the first photoresist PR1 may be removed first so that only both ends of the first photoresist PR1 may remain after the etching process, thereby forming the second photoresist PR2. The second photoresist PR2 may serve as a mask for patterning the second metal layer CML to form the source electrode and the drain electrode.

By patterning the second metal layer CML along the second photoresist PR2, the first source electrode 330 and the first drain electrode 340 on the first active layer 350 may be formed, and the second source electrode 430 and the second drain electrode 440 on the second active layer 450 may be formed.

Figure 20:
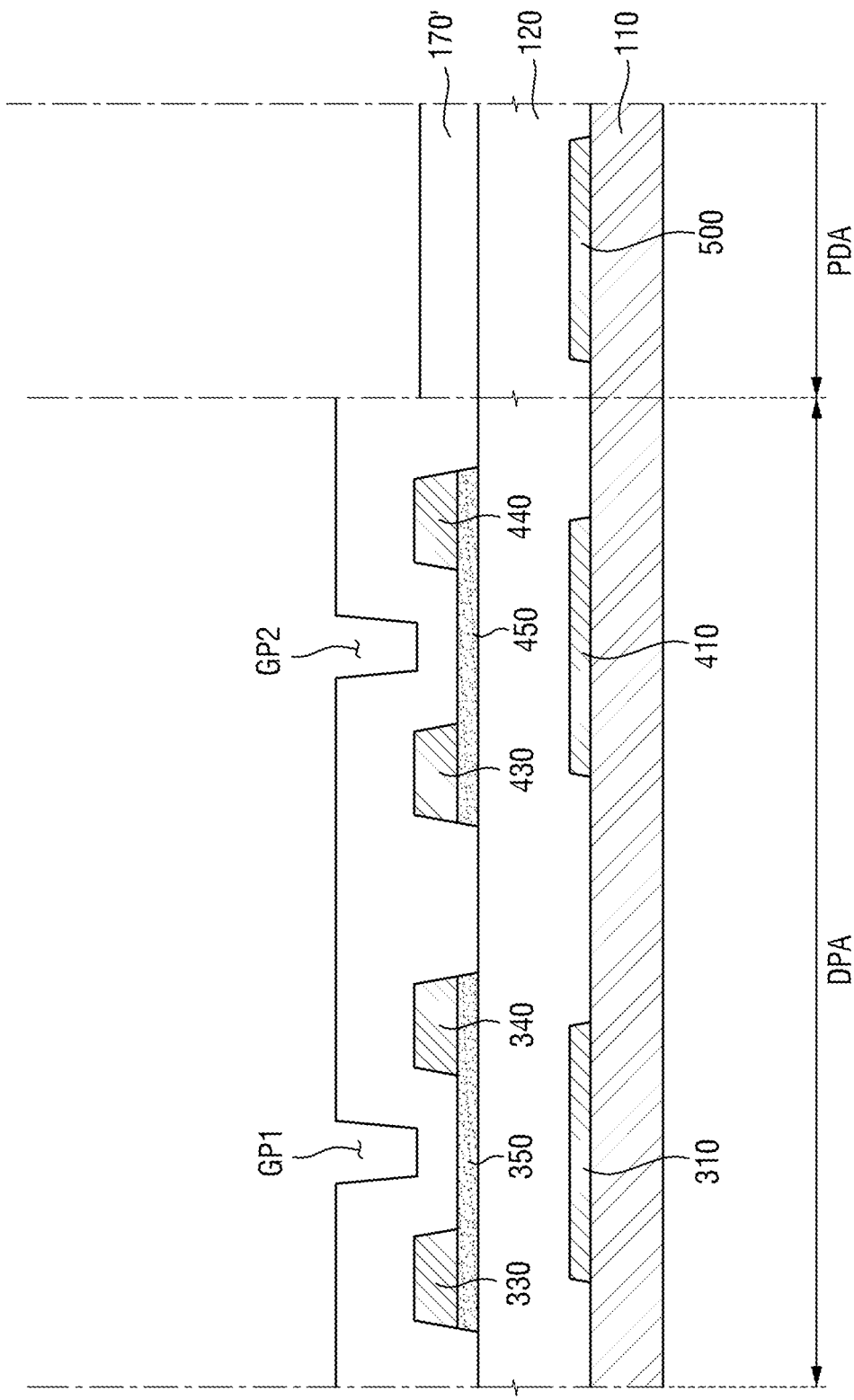
Figure 21:
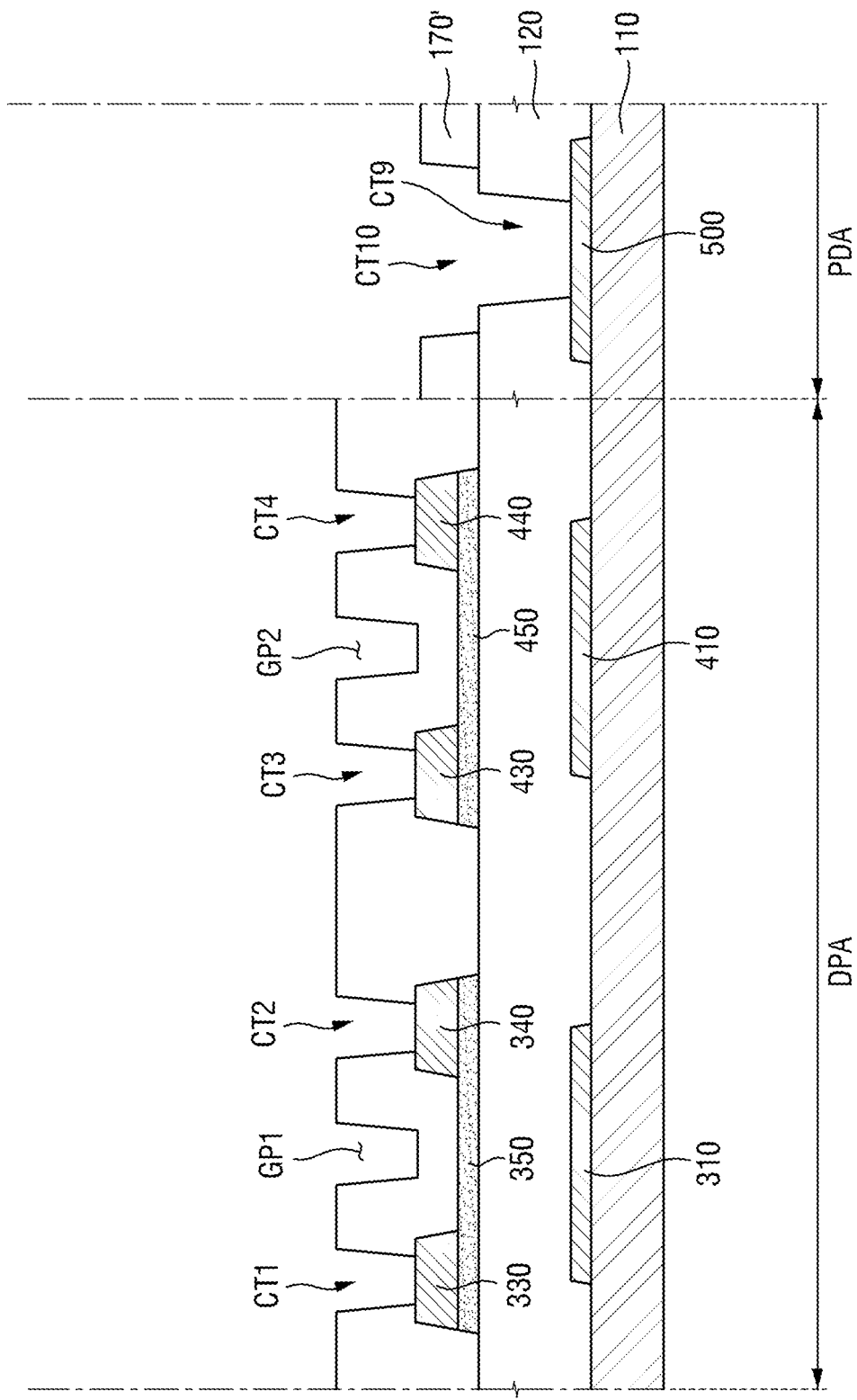

Referring to FIGS. 20 and 21, the second photoresist PR2 is removed, and a first protective layer 170 is formed on the source electrodes and the drain electrodes. The step of forming the first protective layer 170 may include forming a first insulating layer 170' on the source electrode and the drain electrode, and etching a portion of the first insulating layer 170' to form a plurality of contact holes. The first insulating layer 170' may be substantially identical to the first protective layer 170. There may be level differences on the upper surface of the first insulating layer 170' due to (e.g., caused by) the source and drain electrodes thereunder. For example, grooves GP may be formed between the source electrode and the drain electrode, in which a portion of the upper surface of the first insulating layer 170' is recessed.

The process of forming a plurality of contact holes by partially etching (e.g., by etching portions of) the first insulating layer 170' may be performed through any suitable patterning process generally available.

The first protective layer 170 may include a first contact hole CT1, a second contact hole CT2, a third contact hole CT3 and a fourth contact hole CT4 in the display area DPA. During the process of forming the first protective layer 170, the first protective layer 170 and the buffer layer 120 in the pad area PDA may be partially etched. As the first protective layer 170 and the buffer layer 120 have different etching selectivities (e.g., different etching requirements), by etching them during different patterning processes, a ninth contact hole CT9 and a tenth contact CT10 hole having different diameters may be formed. However, embodiments of the present disclosure are not limited thereto.

Figure 22:
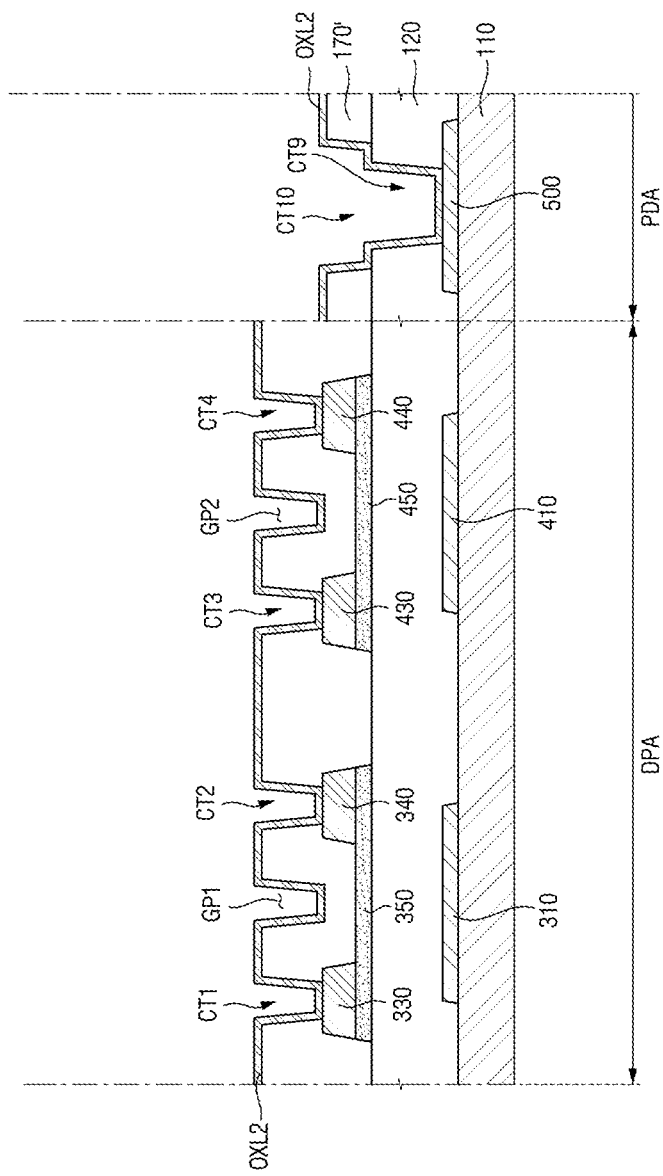
Figure 23:
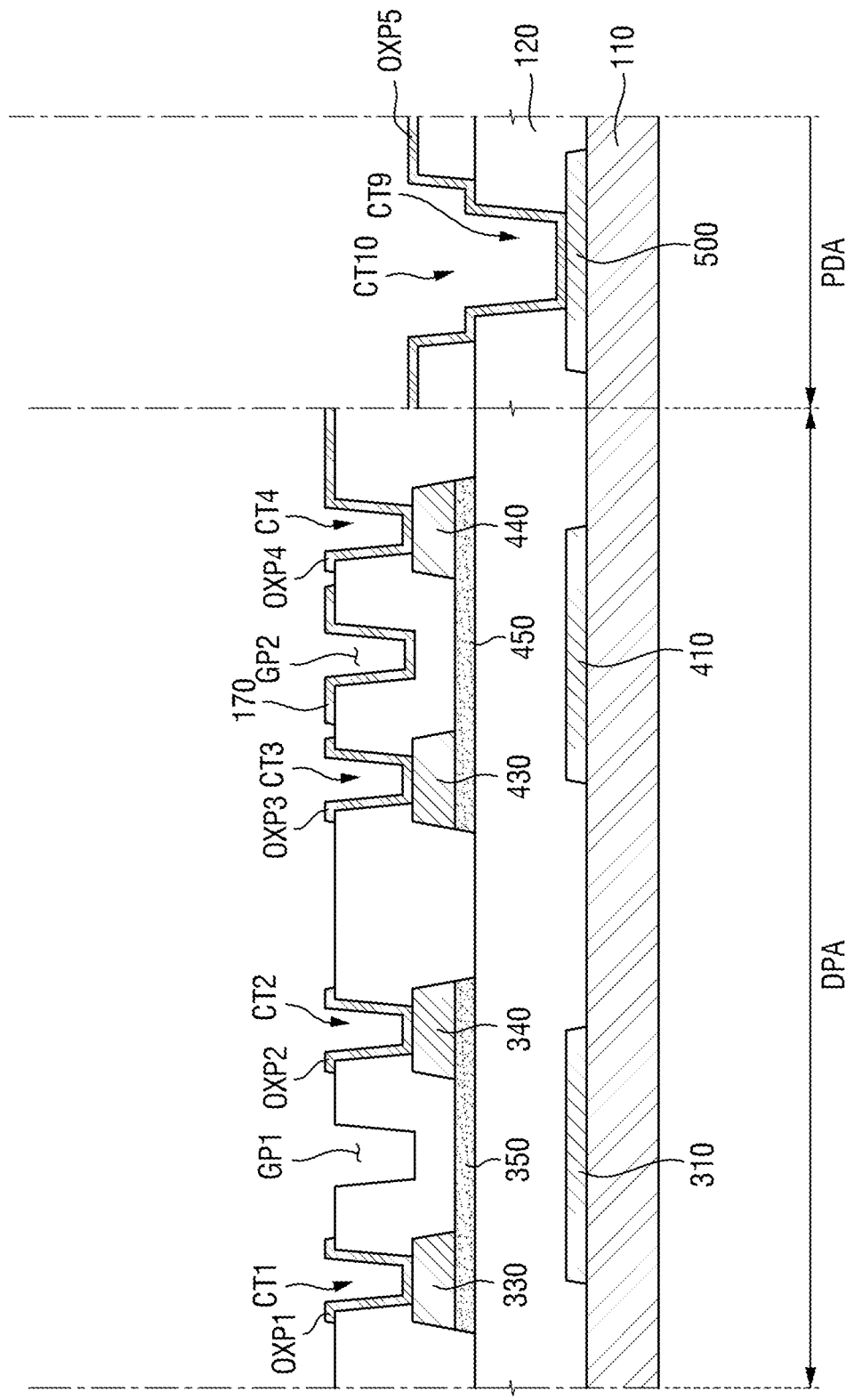

Referring to FIGS. 22 and 23, a second oxide semiconductor layer OXL2 is formed on the first protective layer 170 and is partially patterned to form a second semiconductor layer. A plurality of oxide patterns OXP and oxide layers (e.g., the second oxide layer 470) may be formed from the second semiconductor layer during a subsequent process. The second oxide semiconductor layer OXL2 is formed entirely on the first protective layer 170, and a portion of the second oxide semiconductor layer OXL2 is patterned and removed during the process of forming the second semiconductor layer. Accordingly, the oxide patterns OXP may be spaced apart from each other, and the second oxide semiconductor layer OXL2 formed in the second groove GP2 of the first protective layer 170 may form the second oxide layer 470.

Figure 24:
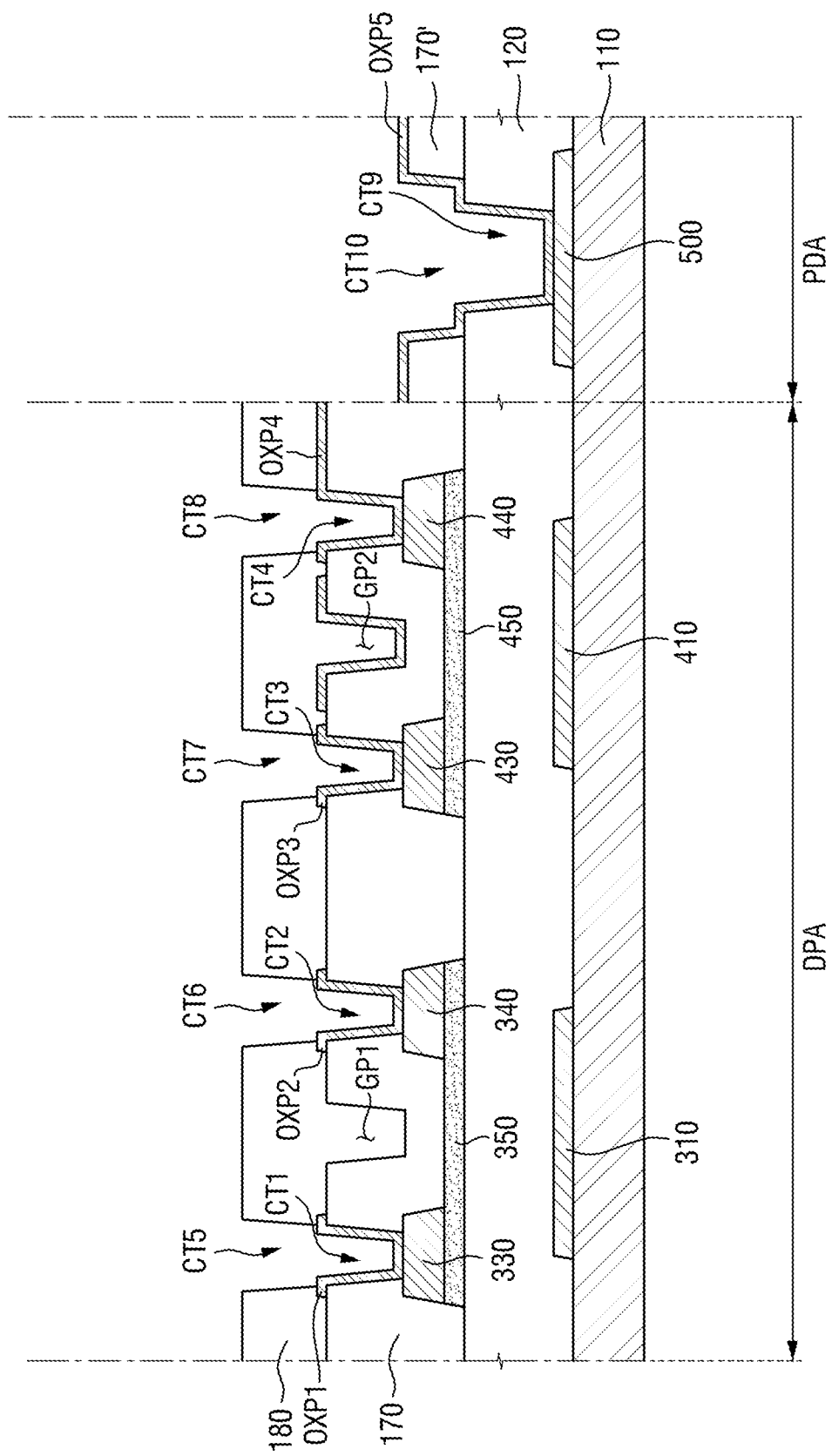
Figure 25:
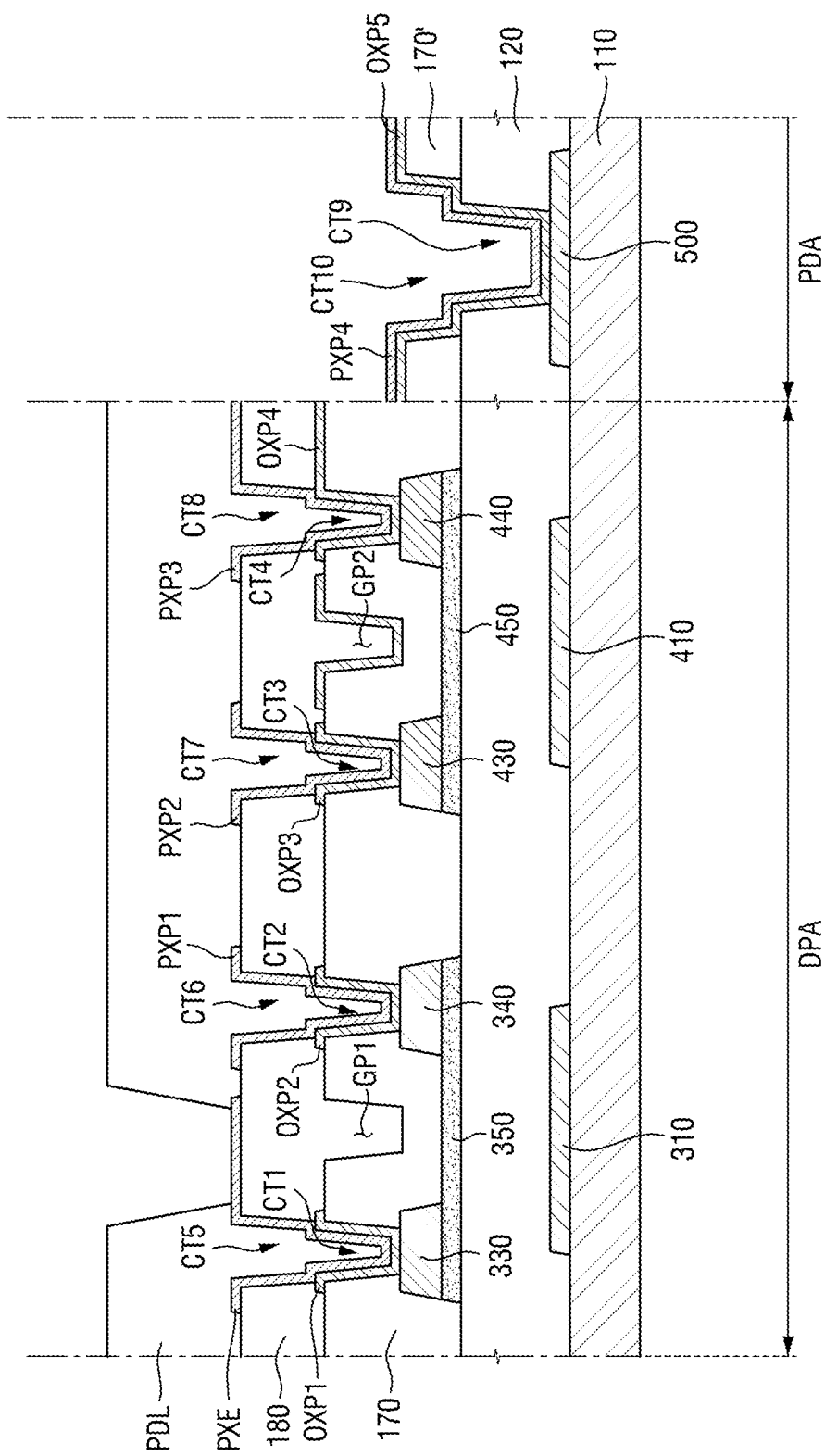

Referring to FIGS. 24 and 25, a first planarization layer 180 is formed on the second semiconductor layer, and a third conductive layer and the pixel-defining layer PDL are formed on the first planarization layer 180. The step of forming the first planarization layer 180 may be substantially identical to the step of forming the first protective layer 170. For example, the first planarization layer 180 may be formed by forming a second insulating layer entirely on the first protective layer 170 (e.g., on the entire first protective layer 170) and then partially patterning it to form a plurality of contact holes. Such structures have already been described above; and, therefore, the redundant description will not be repeated here.

An organic emission layer EML, a second electrode CME, an encapsulation layer, etc. are formed on the first electrode PXE, to produce the display device 1.

By performing the above-described processes, the display device 1 according to some embodiments of the present disclosure can be fabricated. In the process of fabricating the display device 1, the step of forming the first conductive layer including the gate electrode is performed before the step of forming the first semiconductor layer including the active layer, so that a driving transistor DRT and a switching transistor SCT having a bottom-gate structure can be formed. In addition, the step of forming the second semiconductor layer including the oxide layer may be performed after the step of forming the active layer, so that at least one selected from the driving transistor DRT and the switching transistor SCT may include the oxide layer.

Hereinafter, a variety of structures of the driving transistor DRT and the switching transistor SCT will be described with reference to the drawings.

FIG. 26 is a plan view showing a driving transistor according to some embodiments of the present disclosure. FIG. 27 is a cross-sectional view showing an example of a display device including the driving transistor of FIG. 26.

Referring to FIGS. 26 and 27, in the display device 1 according to some embodiments of the present disclosure, a driving transistor DRT_1 may also include a first oxide layer 370_1 on a first active layer 350_1. Some embodiments are different from some embodiments of FIGS. 5 and 7 in that the driving transistor DRT_1 includes the first oxide layer 370_1. Therefore, descriptions will focus on differences, and the redundant description will not be repeated here.

In some embodiments, as shown in FIGS. 26 and 27, the driving transistor DRT_1 may further include the first oxide layer 370_1 above the first active layer 350_1. The first oxide layer 370_1 is in the first groove GP1 of the first protective layer 170. The width of the first oxide layer 370_1 may be greater than the width between the first source electrode 330 and the first drain electrode 340. At least a portion of the first oxide layer 370_1 may overlap the first source electrode 330 and the first drain electrode 340 in the thickness direction.

The driving transistor DRT_1 may have a higher mobility because a larger amount of hydrogen H is introduced from the insulating layer on the active layer and, accordingly, may have a large number of carriers. However, if too many carriers are generated in the active layer of the driving transistor DRT_1, then it may be difficult to ensure a driving voltage for driving each pixel PX. When the first active layer 350_1 of the driving transistor DRT has a short channel region, the driving voltage may have a narrower range. Therefore, the display device 1 according to some embodiments further includes the first oxide layer 370_1 above the first active layer 350_1 of the driving transistor DRT_1, so that the driving transistor DRT_1 can have a high mobility while ensuring a wide range of driving voltages, even in embodiments where the channel region has a short length.

The structure, material, etc. of the first oxide layer 370_1 are the same or substantially the same as those of the second oxide layer 470; and, therefore, the redundant description will not be repeated here.

Figure 28:
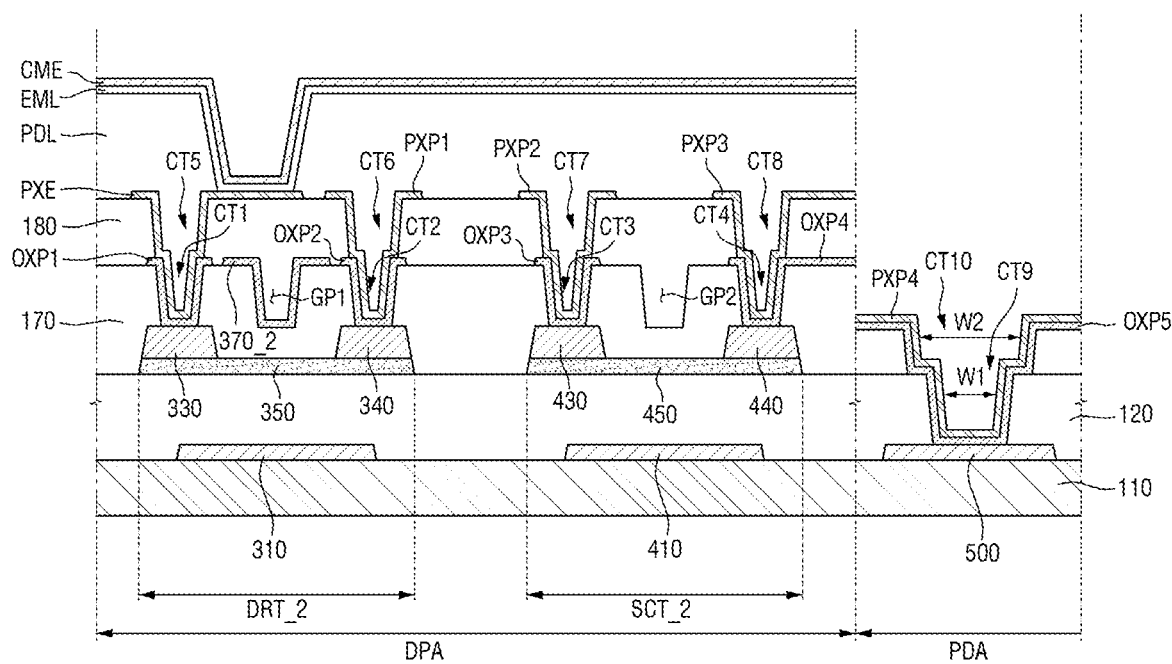
FIG. 28 is a cross-sectional view of a display device according to some embodiments of the present disclosure.

FIG. 28 is a cross-sectional view of a display device according to some embodiments of the present disclosure.

In some embodiments, as shown in FIG. 28, only a driving transistor DRT_2 may include a first oxide layer 370_2, while a switching transistor SCT_2 may not include a second oxide layer 470_2. Some embodiments are different from some embodiments of FIG. 27 in that the second oxide layer 470_2 of the switching transistor SCT_2 is eliminated. The other features are the same or substantially the same as those described above; and, therefore, the redundant description will not be repeated here.

The electrode pattern PXP of the third conductive layer and the oxide pattern OXP of the second semiconductor layer may be eliminated in some embodiments.

Figure 29:
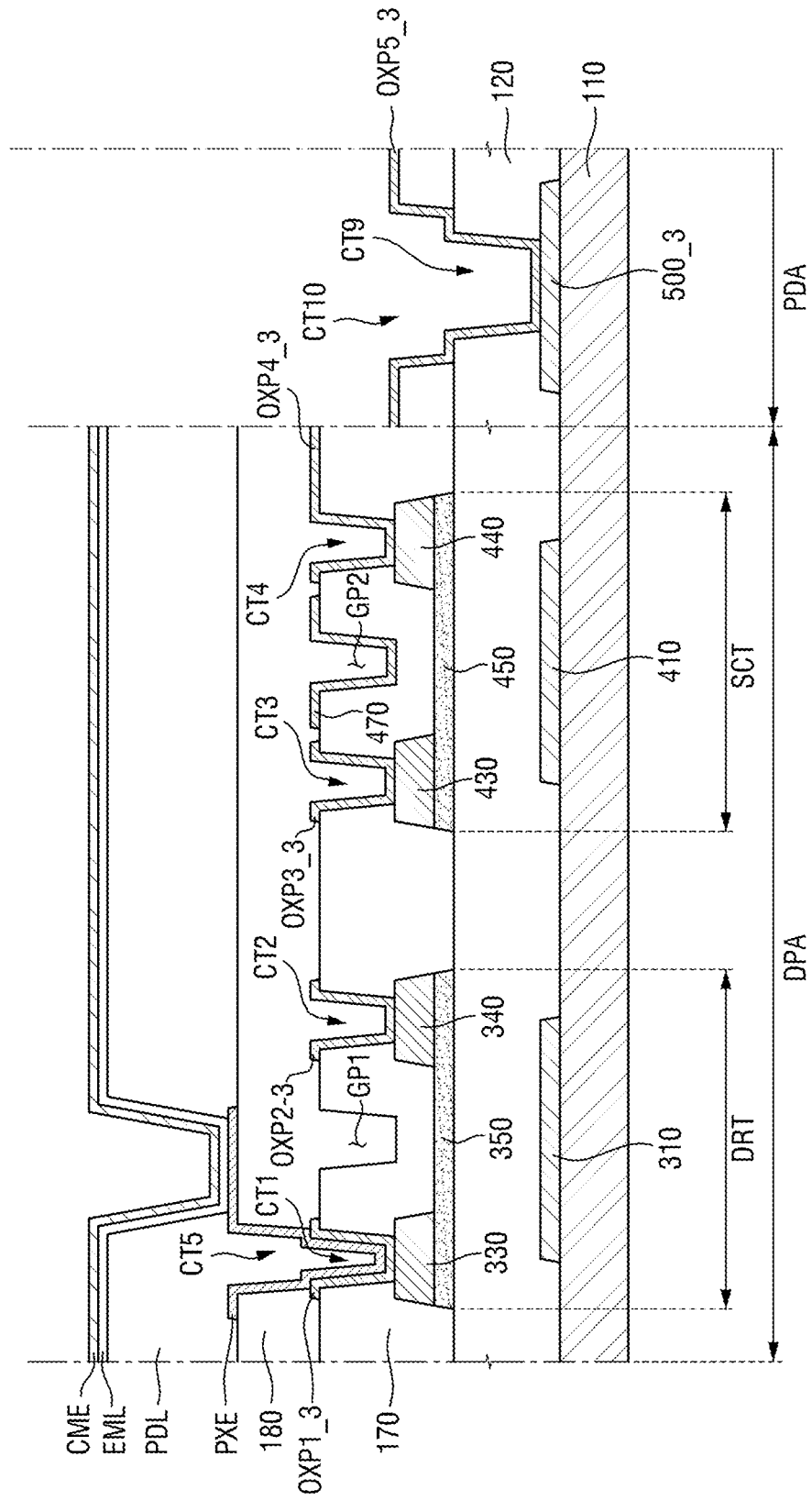
FIGS. 29 and 30 are cross-sectional views showing an example of a display device according to some embodiments of the present disclosure.
Figure 30:
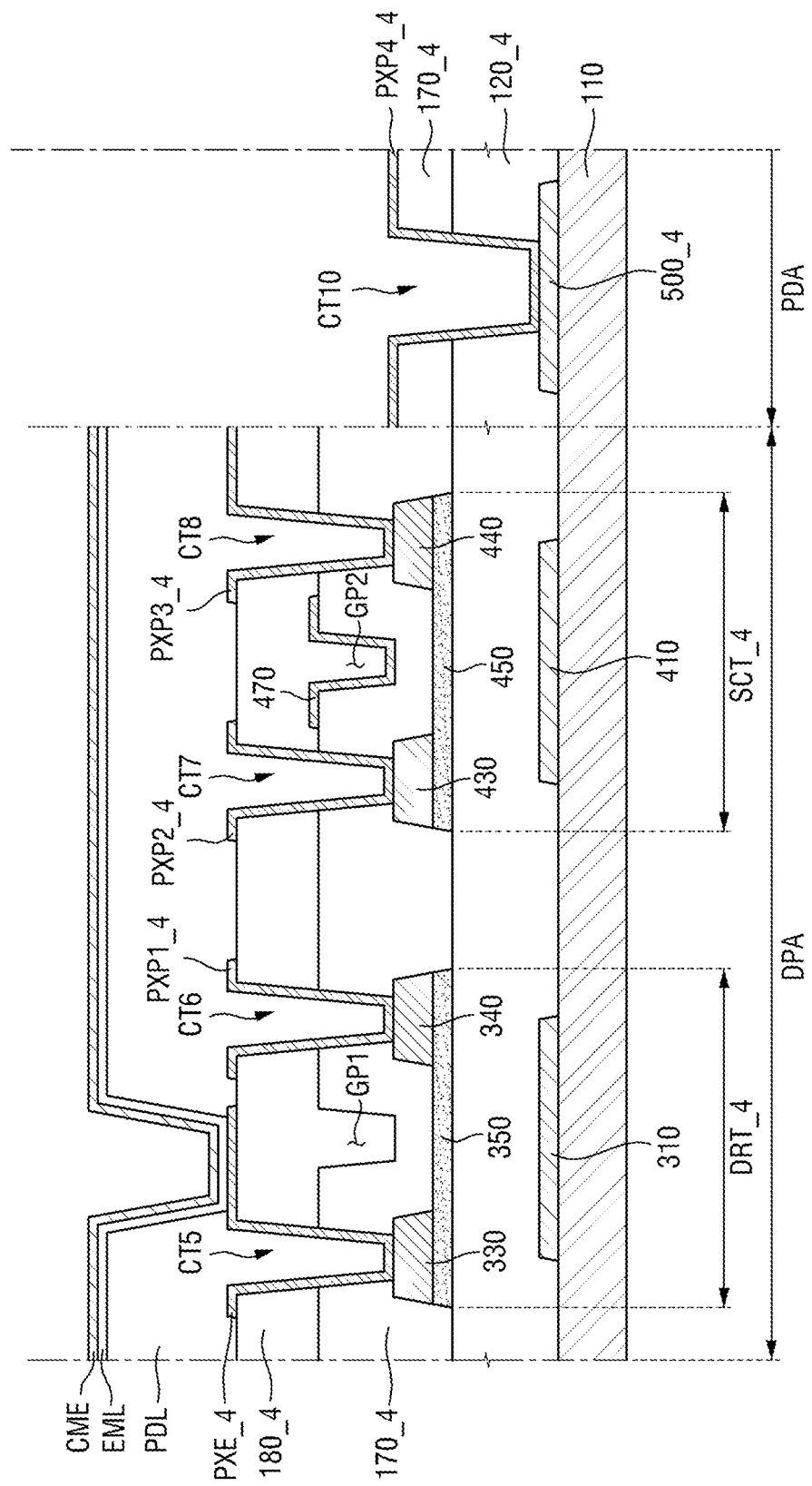

FIGS. 29 and 30 are cross-sectional views showing a display device according to some embodiments of the present disclosure.

Referring to FIG. 29, an electrode pattern PXP of the third conductive layer may be eliminated. Some embodiments are different from some embodiments shown in FIG. 7 in that the electrode pattern PXP is eliminated and the third conductive layer includes only the first electrode PXE, and the sixth contact hole CT6, the seventh contact hole CT7 and the eighth contact hole CT8 in the first planarization layer 180 are omitted. The other elements are the same or substantially the same as those described above with reference to FIG. 7; and, therefore, the redundant description will not be repeated here.

Referring to FIG. 30, an oxide pattern OXP of the second conductive layer may be eliminated. Some embodiments are different from some embodiments shown in FIG. 7 in that the oxide pattern OXP is eliminated and, accordingly, the source electrode and the drain electrode of the second conductive layer are in direct contact with the first electrode PXE_4 and the electrode pattern PXP_4 of the third conductive layer. Therefore, descriptions will focus on differences, and the redundant description will not be repeated here.

As shown in the drawings, the plurality of oxide patterns OXP may be eliminated, and the first electrode PXE_4 and the electrode patterns PXP_4 of the third conductive layer may be in direct contact with the source electrodes and the drain electrodes of the second conductive layer. For example, a first electrode PXE_4 may be in contact (e.g., direct contact) with the first source electrode 330, a first electrode pattern PXP1_4 may be in contact (e.g., direct contact) with the first drain electrode 340, a second electrode pattern PXP2_4 may be in contact (e.g., direct contact) with the second source electrode 430, and a third electrode pattern PXP3_4 may be in contact (e.g., direct contact) with the second drain electrode 440. In addition, the fourth electrode pattern PXP4_4 in the pad area PDA may be in direct contact with the pad electrode 500_4.

In some embodiments, the contact holes in the display area DPA portion of the first protective layer 170_4 may be omitted, while the contact holes in the first planarization layer 180_4 may extend to (e.g., through) the first protective layer 170_4 so that a portion of the second conductive layer may be exposed. For example, the fifth to eighth contact holes CT5, CT6, CT7 and CT8 may penetrate through the first planarization layer 180_4 and through the first protective layer 170_4 to expose a portion of the second conductive layer. These contact holes may be formed by etching the first protective layer 170_4 and the first planarization layer 180_4 via the same process.

Figure 31:
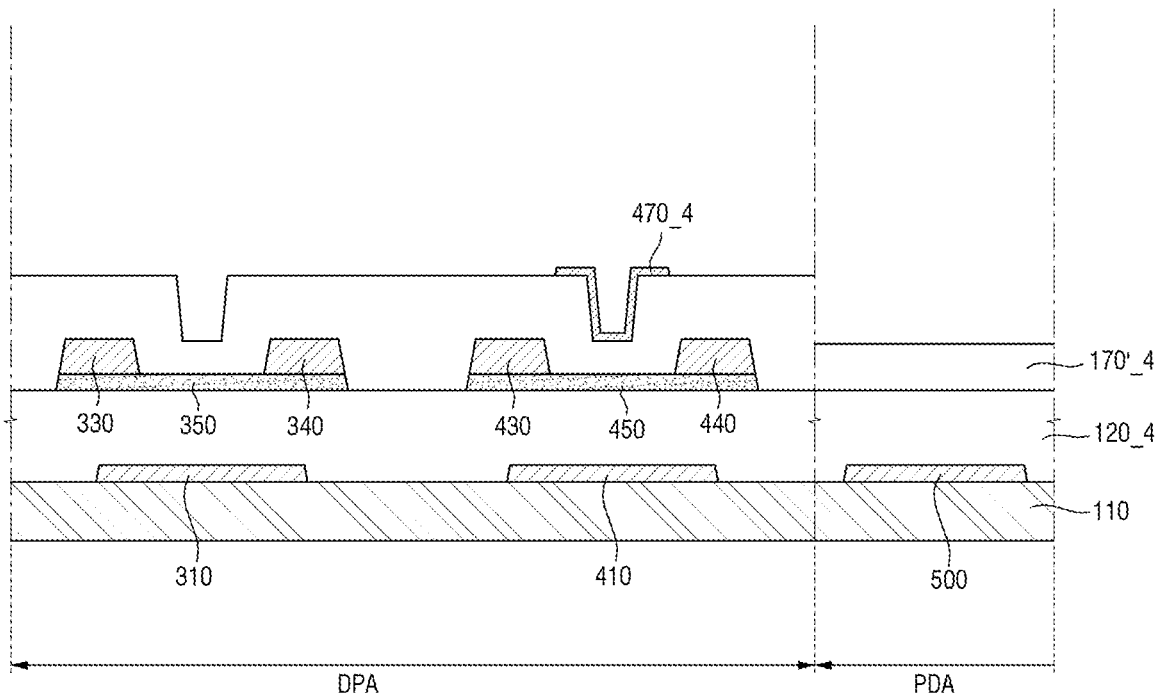
FIGS. 31 to 33 are cross-sectional views showing some of the processing steps of a method of fabricating the display device shown in FIG. 30 according to some embodiments of the present disclosure.
Figure 32:
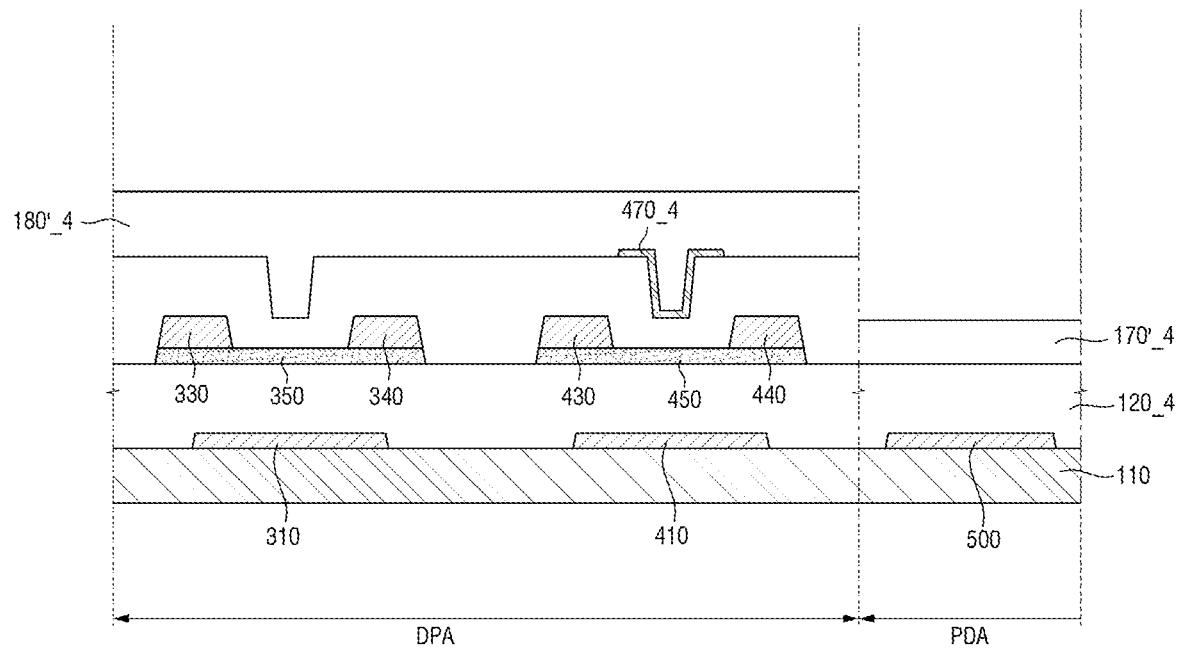
Figure 33:
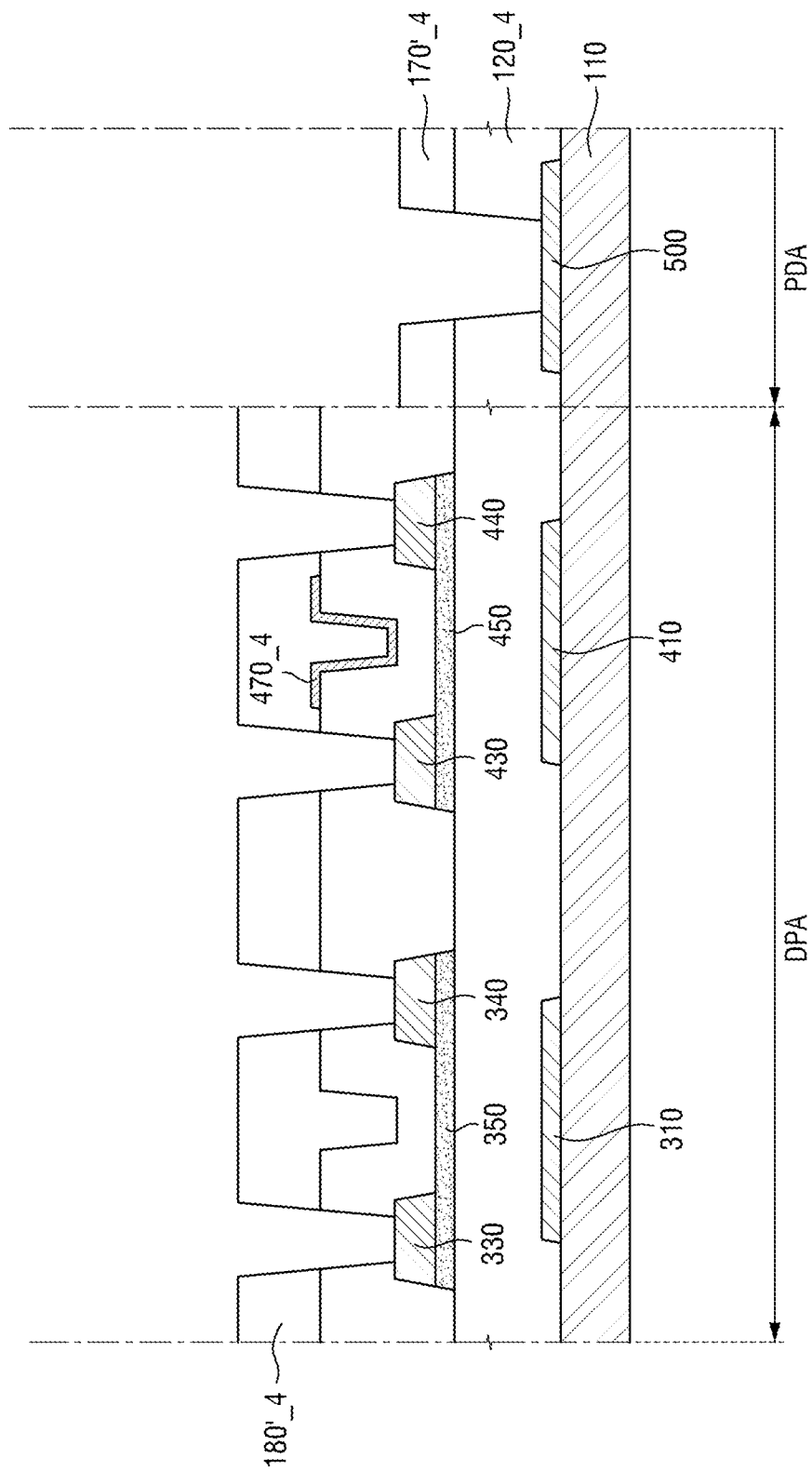

FIGS. 31 to 33 are cross-sectional views showing some of the processing steps of a method of fabricating embodiments of the display device shown in FIG. 30.

Referring to FIG. 31, a second conductive layer is formed, and then a first insulating layer 170'_4 is formed thereon. In the process of fabricating the display device 1 according to some embodiments, a second oxide layer 470_4 is formed first before the plurality of contact holes is formed in the first insulating layer 170'_4. The second oxide semiconductor layer OXL2 formed on the first insulating layer 170'_4 may be formed only on some portions of the first insulating layer 170'_4, thereby forming the second oxide layer 470_4. However, embodiments of the present disclosure are not limited thereto. For example, in some embodiments, the second oxide semiconductor layer OXL2 may be formed entirely on the first insulating layer 170'_4, and portions of the second oxide semiconductor layer OXL2 may be etched and removed to form the second oxide layer 470_4.

Referring to FIGS. 32 and 33, a second insulating layer 180'_4 is formed entirely on the first insulating layer 170'_4, and the first insulating layer 170'_4 and the second insulating layer 180'_4 are etched during the same process, to form a plurality of contact holes. In doing so, the first insulating layer 170'_4 and the second insulating layer 180'_4 are etched simultaneously in the display area DPA, and the first insulating layer 170'_4 and the buffer layer 120_4 may be etched simultaneously in the pad area PDA. Therefore, the contact holes in the display area DPA may pass through (e.g., penetrate through) the first planarization layer 180_4 and the first protective layer 170_4 to expose a portion of the second conductive layer, and the contact hole in the pad area PDA may pass through (e.g., penetrate through) the first protective layer 170_4 and the buffer layer 120_4 to expose a portion of the second conductive layer. According to some embodiments of the present disclosure, the inner sidewalls of the contact holes in first planarization layer 180_4 and the first protective layer 170_4 may be aligned with each other. They may be patterned and formed via the same etching process, and thus, the sidewalls of the contact holes in the first planarization layer 180_4 and the first protective layer 170_4 may be aligned with each other. In addition, the inner sidewalls of the contact hole in the first protective layer 170_4 and the buffer layer 120_4 may be aligned with each other. However, embodiments of the present disclosure are not limited thereto.

In some embodiments, the source electrode and the drain electrode are not only on the active layer, but may also be directly on the buffer layer 120.

Figure 34:
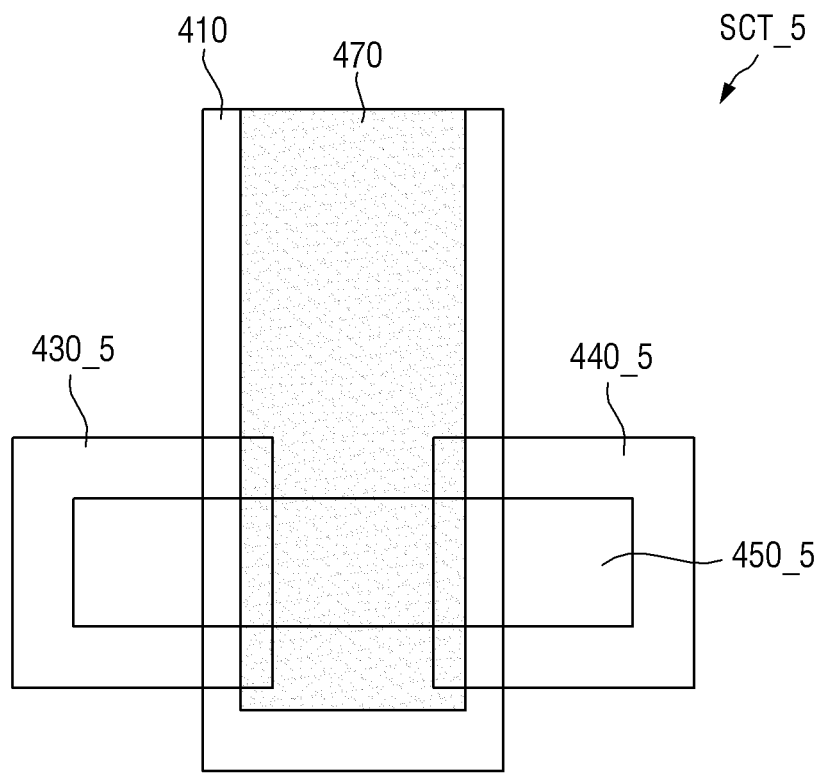
FIG. 34 is a plan view showing a switching transistor according to some embodiments of the present disclosure.
Figure 35:
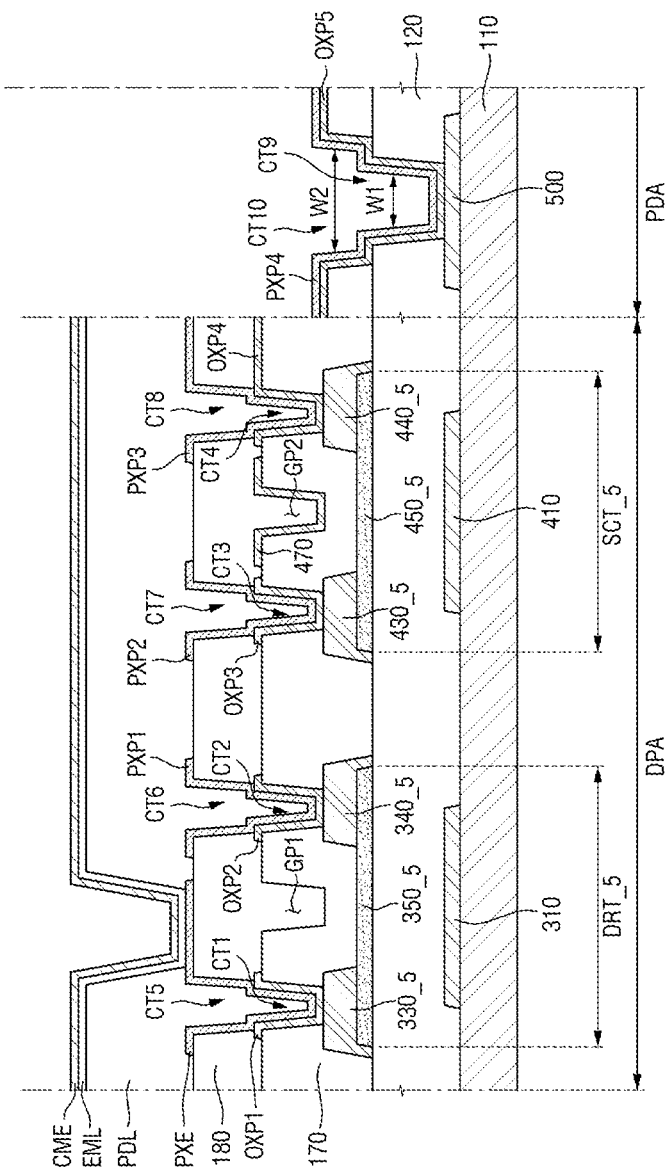
FIG. 35 is a cross-sectional view showing a display device including the switching transistor of FIG. 34 according to some embodiments of the present disclosure.

FIG. 34 is a plan view showing a switching transistor according to some embodiments of the present disclosure. FIG. 35 is a cross-sectional view showing a display device including the switching transistor of FIG. 34.

Referring to FIGS. 34 and 35, in some embodiments, the source electrodes 330_5 and 430_5 and the drain electrodes 340_5 and 440_5 of the driving transistor DRT_5 and the switching transistor SCT_5 may also be on the buffer layer 120. Some embodiments are different from some embodiments of FIG. 7 in that the shape of the source electrodes and the drain electrodes of the second conductive layer are different. Therefore, descriptions will focus on differences, and the redundant description will not be repeated here.

One side of each of the source electrodes 330_5 and 430_5 and the drain electrodes 340_5 and 440_5 of the second conductive layer may be on the buffer layer 120, while the other side of each of them may be on the active layers 350_5 and 450_5 of the first semiconductor layer. For example, one side (e.g., the left side) of the first source electrode 330_5 may be on the buffer layer 120, while the other side (e.g., the right side thereof) may be on the first active layer 350_5. One side (e.g., the right side) of the first drain electrode 340_5 may be on the buffer layer 120, while the other side (e.g., the left side thereof) may be positioned on the first active layer 350_5. Likewise, one side of each of the second source electrode 430_5 and the second drain electrode 440_5 may be on the buffer layer 120, while the other side thereof may be on the second active layer 450_5.

Such a structure may be formed by patterning a portion of the first semiconductor layer and the second conductive layer during different processes. According to some embodiments of the present disclosure, a portion of the first semiconductor layer is patterned before the second conductive layer is formed, such that the first active layer 350_5 and the second active layer 450_5 may be formed. The second conductive layer is subsequently formed, such that one side of the source electrode and the drain electrode of the second conductive layer may not be aligned with the active layer of the first semiconductor layer.

Figure 36:
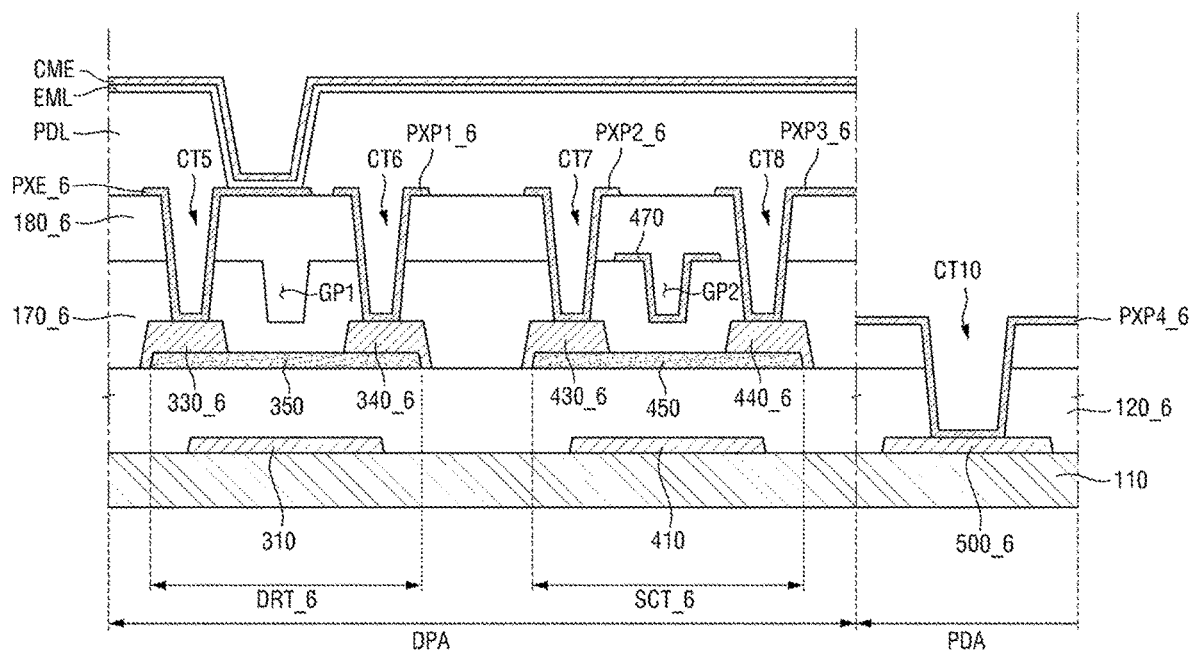
FIG. 36 is a cross-sectional view of a display device according to some embodiments of the present disclosure.

FIG. 36 is a cross-sectional view of a display device according to some embodiments of the present disclosure.

Referring to FIG. 36, according to some embodiments of the present disclosure, a portion of each of source electrodes 330_6 and 430_6 and the drain electrodes 340_6 and 440_6 of the driving transistor DRT_6 and the switching transistor SCT_6 may be on the buffer layer 120_6, and the oxide pattern OXP may be omitted. Some embodiments are different from some embodiments shown in FIG. 35 in that the oxide pattern OXP is omitted, and accordingly, the source electrodes 330_6 and 430_6 and the drain electrodes 340_6 and 440_6 of the second conductive layer are in direct contact with the first electrode PXE_6 and the electrode pattern PXP_6 of the third conductive layer. The other features are the same or substantially the same as those described above with reference to FIGS. 30 and 35; and, therefore, the redundant description will not be repeated here.

Those skilled in the art will appreciate that many variations and modifications may be made to the disclosed embodiments without substantially departing from the principles of the present disclosure. Therefore, the disclosed embodiments of the present disclosure are not provided for purposes of limitation.

What is claimed is:

1. A display device comprising:
   a substrate comprising a display area and a pad area;
   a first conductive layer on the substrate, the first conductive layer comprising a gate electrode in the display area and a pad electrode in the pad area;
   a buffer layer on the first conductive layer, the buffer layer covering the gate electrode and exposing a portion of the pad electrode;
   a first semiconductor layer on the buffer layer and comprising an oxide semiconductor, the first semiconductor layer comprising a first active layer and a second active layer in the display area;
   a second conductive layer on the first semiconductor layer, the second conductive layer comprising source electrodes and drain electrodes in the display area;
   a first protective layer on the second conductive layer, the first protective layer covering the source electrode and the drain electrode and exposing a portion of the pad electrode;
   a second semiconductor layer on the first protective layer and comprising an oxide semiconductor, the second semiconductor layer comprising at least one oxide layer in the display area;
   a first planarization layer on the second semiconductor layer; and
   a third conductive layer on the first planarization layer, the third conductive layer comprising a first electrode electrically connected to one of the source electrodes through a contact hole penetrating through the first planarization layer and the first protective layer,
   wherein the oxide layer of the second semiconductor layer is above at least one selected from the first active layer and the second active layer,
   the oxide layer and the first electrode are disposed at different layers, and
   the first planarization layer is disposed between the oxide layer and the first electrode in a thickness direction normal to an upper surface of the substrate.

2. The display device of claim 1, wherein the oxide semiconductor of the first semiconductor layer and the second semiconductor layer comprises at least one selected from the group consisting of indium (In), gallium (Ga), zinc (Zn), tin (Sn), and hafnium (Hf).

3. The display device of claim 1, wherein the second conductive layer comprises:
   a first source electrode at a first side of the first active layer;
   a first drain electrode at a second side of the first active layer;

a second source electrode at a first side of the second active layer; and a second drain electrode at a second side of the second active layer.

4. The display device of claim 3, wherein one side of the first source electrode is aligned with one side of the first active layer, and one side of the first drain electrode is aligned with another side of the first active layer, and wherein another side of the first source electrode and another side of the first drain electrode are on the first active layer.

5. The display device of claim 4, wherein one side of the second source electrode is on the buffer layer, and one side of the second drain electrode is on the buffer layer, and wherein another side of the second source electrode and another side of the second drain electrode are on the second active layer.

6. The display device of claim 3, wherein the first protective layer comprises a plurality of grooves in which a portion of an upper surface of the first protective layer is recessed, and wherein the grooves comprise a first groove between the first source electrode and the first drain electrode, and a second groove between the second source electrode and the second drain electrode.

7. The display device of claim 6, wherein the oxide layer of the second semiconductor layer is in contact with the gate electrode through a contact hole penetrating through the first protective layer and through the buffer layer to expose a portion of an upper surface of the gate electrode.

8. The display device of claim 6, wherein the oxide layer comprises a first oxide layer above the first active layer.

9. The display device of claim 8, wherein the first groove overlaps the first active layer in the thickness direction, and wherein the first oxide layer is in the first groove.

10. The display device of claim 6, wherein the second groove overlaps the second active layer in the thickness direction, and wherein the oxide layer comprises a second oxide layer in the second groove above the second active layer.

11. The display device of claim 6, wherein the first protective layer comprises a first contact hole penetrating through the first protective layer to expose a portion of an upper surface of the first source electrode, and a second contact hole penetrating through the first protective layer to expose a portion of an upper surface of the first drain electrode.

12. The display device of claim 11, wherein the second semiconductor layer comprises a first oxide pattern in contact with the first source electrode through the first contact hole, and a second oxide pattern in contact with the first drain electrode through the second contact hole.

13. The display device of claim 6, wherein the first planarization layer comprises: a third contact hole penetrating through the first planarization layer and through the first protective layer to expose a portion of an upper surface of the second source electrode, and a fourth contact hole penetrating through the first planarization layer and through the first protective layer to expose a portion of an upper surface of the second drain electrode.

14. The display device of claim 13, wherein the third conductive layer comprises a first electrode pattern in contact with the second source electrode through the third contact hole, and a second electrode pattern in contact with the second drain electrode through the fourth contact hole.

15. The display device of claim 1, wherein the buffer layer comprises a fifth contact hole penetrating through the buffer layer to expose a portion of an upper surface of the pad electrode, and wherein the second semiconductor layer is in the pad area and further comprises a third oxide pattern in contact with the pad electrode through the fifth contact hole.

16. The display device of claim 15, wherein the first protective layer further comprises a sixth contact hole penetrating through the first protective layer to expose a portion of the third oxide pattern and a portion of an upper surface of the buffer layer, and wherein the third conductive layer further comprises a third electrode pattern in the pad area and in contact with the third oxide pattern through the sixth contact hole.

17. A display device comprising pixels connected to scan lines and data lines intersecting the scan lines, wherein each of the pixels comprises: a light-emitting element, a driving transistor to control a driving current supplied to the light-emitting element according to a data voltage applied from the data lines, and a switching transistor to apply the data voltage of the data line to the driving transistor according to a scan signal applied from the scan lines, wherein the driving transistor comprises a first active layer having an oxide semiconductor and a first gate electrode below the first active layer, wherein the switching transistor comprises a second active layer having a same oxide semiconductor as the oxide semiconductor of the first active layer and a second gate electrode below the second active layer, wherein at least one selected from the driving transistor and the switching transistor comprises an oxide layer above each of the active layers, and wherein at least one selected from the driving transistor and the switching transistor has an electrode on the corresponding active layer, the electrode having a side coplanar with, and extending in a thickness direction normal to an upper surface of the corresponding active layer from, a side of the corresponding active layer.

18. The display device of claim 17, wherein the oxide semiconductor of the oxide layer comprises at least one selected from the group consisting of indium (In), gallium (Ga), zinc (Zn), tin (Sn), and hafnium (Hf).

19. The display device of claim 18, wherein a first protective layer is on the first active layer of the driving transistor and on the second active layer of the switching transistor, and wherein the driving transistor further comprises a first oxide layer on the first protective layer and overlapping the first active layer in the thickness direction.

20. The display device of claim 19, wherein the switching transistor further comprises a second oxide layer on the first protective layer and overlapping the second active layer in the thickness direction.

* * * * *